United States Patent
Kim et al.

(10) Patent No.: US 11,905,305 B2
(45) Date of Patent: Feb. 20, 2024

(54) SILICON PRECURSOR COMPOUND, PREPARATION METHOD THEREFOR, AND SILICON-CONTAINING FILM FORMATION METHOD USING SAME

(71) Applicant: UP CHEMICAL CO., LTD., Pyeongtaek-si (KR)

(72) Inventors: Jin Sik Kim, Pyeongtaek-si (KR); Myeong Ho Kim, Cheonan-si (KR); Mi Hee Lee, Daegu (KR); Byung Kwan Kim, Pyeongtaek-si (KR); Jun Hwan Choi, Goyang-si (KR); Sungwoo Ahn, Yangju-si (KR); Yun Gyeong Yi, Guri-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/320,326

(22) Filed: May 14, 2021

(65) Prior Publication Data

US 2021/0269463 A1  Sep. 2, 2021

Related U.S. Application Data

(63) Continuation of application No. PCT/KR2019/015676, filed on Nov. 15, 2019.

(30) Foreign Application Priority Data

Nov. 15, 2018  (KR) .................. 10-2018-0140389

(51) Int. Cl.
 *C07F 7/10* (2006.01)
 *C23C 16/24* (2006.01)
 *C23C 16/32* (2006.01)
 *C23C 16/34* (2006.01)
 *C23C 16/40* (2006.01)
 *C23C 16/455* (2006.01)

(52) U.S. Cl.
 CPC ............ *C07F 7/10* (2013.01); *C23C 16/24* (2013.01); *C23C 16/325* (2013.01); *C23C 16/345* (2013.01); *C23C 16/401* (2013.01); *C23C 16/45536* (2013.01); *C23C 16/45553* (2013.01)

(58) Field of Classification Search
 CPC ......................................... C07F 7/10
 See application file for complete search history.

(56) References Cited

U.S. PATENT DOCUMENTS

| | | | | |
|---|---|---|---|---|
| 2006/0258173 A1* | 11/2006 | Xiao | ................. | H01L 21/02271 438/780 |
| 2009/0075490 A1* | 3/2009 | Dussarrat | ............ | H01L 21/0228 257/E21.24 |
| 2013/0129940 A1* | 5/2013 | Xiao | ....................... | C23C 16/32 556/412 |
| 2014/0120738 A1* | 5/2014 | Jung | ................ | C23C 16/45536 438/778 |
| 2015/0099375 A1* | 4/2015 | Haripin | ............. | C23C 16/45523 438/793 |
| 2015/0125628 A1* | 5/2015 | Kim | ........................ | C23C 16/50 427/579 |
| 2015/0125629 A1* | 5/2015 | Kim | ..................... | C23C 16/401 427/579 |
| 2015/0147871 A1* | 5/2015 | Xiao | ................ | C23C 16/45544 556/412 |
| 2016/0141172 A1* | 5/2016 | Kang | .................. | H01L 21/0332 438/787 |
| 2017/0186603 A1* | 6/2017 | Moon | ............... | H01L 21/02219 |
| 2020/0131205 A1* | 4/2020 | Kim | ......................... | C07F 7/10 |
| 2021/0147451 A1* | 5/2021 | Kim | ......................... | C23C 16/30 |
| 2022/0396592 A1* | 12/2022 | Kim | ......................... | C07F 7/10 |

FOREIGN PATENT DOCUMENTS

| | | | |
|---|---|---|---|
| CN | 102827198 A | 12/2012 | |
| CN | 104250258 A | 12/2014 | |
| CN | 108431013 A | 8/2018 | |
| KR | 10-2012-0132403 A | 12/2012 | |
| KR | 10-2018-0027714 A | 3/2018 | |
| KR | 2018027714 A * | 3/2018 | ......... H01L 51/0094 |
| KR | 10-2018-0118062 A | 10/2018 | |
| KR | 10-2018-0118064 A | 10/2018 | |

OTHER PUBLICATIONS

H. Stüger et al., 547 Journal of Organometallic Chemistry, 227-233 (1997) (Year: 1997).*
H. Stüger et al., Organosilicon Chemistry III, "Multifunctional Disilane Derivatives", 257-261 (1998) (Year: 1998).*
CAS Abstract Registry No. 2355205-33-1 (Jul. 10, 2019) (Year: 2019).*
International Search Report of PCT/KR2019/015676 dated Feb. 25, 2020.
Stuger, H. at el., Journal of organometallic chemistry 547 (1997) 227-233.

* cited by examiner

*Primary Examiner* — Alexander R Pagano
(74) *Attorney, Agent, or Firm* — Shih IP Law Group, PLLC

(57) ABSTRACT

The present application relates to a silicon precursor compound, a method for preparing the silicon precursor compound, a precursor composition for depositing a silicon-containing oxide thin film or nitride thin film, the precursor composition comprising the silicon precursor compound, and a method for depositing a silicon-containing oxide thin film or nitride thin film using the precursor composition.

17 Claims, 7 Drawing Sheets

SILICON PRECURSOR COMPOUND, PREPARATION METHOD THEREFOR, AND SILICON-CONTAINING FILM FORMATION METHOD USING SAME

CROSS-REFERENCE TO RELATED APPLICATIONS

This application is a continuation of PCT Application No. PCT/KR2019/015676, filed on Nov. 15, 2019, which claims priority to Korean Patent Application Number 10-2018-0140389, filed on Nov. 15, 2018, both of which are hereby incorporated by reference in their entirety.

TECHNICAL FIELD

The present disclosure relates to a silicon precursor compound, a method of preparing the silicon precursor compound, a precursor composition for forming a silicon-containing film containing the silicon precursor compound, and a method of forming a silicon-containing film using the precursor composition.

BACKGROUND

Silicon-containing oxide and nitride thin films are examples of the thin films which are essential for driving microelectronic devices, such as non-semiconductors (Logic), as well as semiconductors (DRAM, Flash Memory, ReRAM, or PCRAM). Also, these films have been used in cutting-edge technologies, such as flat panel display field, solar cell field and organic light emitting diode (OLED) field including oxide thin film transistors (OTFTs). In a memory device, silicon-containing oxide thin films have been used for a dielectric film, a gate insulating film, a tunneling oxide film, a spacer oxide film, ILD & IMD and a passivation oxide film, and silicon-containing nitride thin films have been used for a diffusion mask, a gate spacer, a gate dielectric film, an etch stopper, a stressor and passivation. In the display field, silicon-containing oxide or nitride thin films have been used for various thin film layers such as a gate dielectric film, an interlayer dielectric film, an insulating film, and a moisture barrier film. Currently, DRAM and flash memories in the memory field and logic memories in the non-memory field have reached physical limitations, and to overcome these limitations, products with a high aspect ratio and three-dimensional structure have been produced. There is a need for silicon-containing oxide or nitride thin films suitable therefor. Accordingly, there is a need for silicon-containing precursors suitable for process temperatures for various application fields, and there is a need for silicon-containing precursors usable for atomic layer deposition methods capable of overcoming a step to overcome a high step ratio. When a silicon-containing oxide or nitride thin film is formed by using an atomic layer deposition method, it is expected to improve the thickness uniformity and physical properties of the thin film and lower the process temperature and thus improve the properties of the semiconductor device. Further, the atomic layer deposition method that has self-limiting mechanism and is capable of forming a uniform thin film needs to be used in order to secure low process temperature and low resistance that may occur due to high integration and scaling down of devices. Accordingly, many studies have been carried out to develop a precursor compound for forming a silicon-containing oxide or nitride thin film that makes it possible to obtain a film having a desired property by the atomic layer deposition method.

U.S. Patent Publication No. 2012/0085733 discloses that when a surface including trenches is covered with a spacer layer having a uniform thickness to increase the pattern density after a lithography process, silicon nitride can be used as a material for the spacer layer.

DISCLOSURE OF THE INVENTION

Problems to be Solved by the Invention

In view of the foregoing, the present disclosure provides a silicon precursor compound, a method of preparing the silicon precursor compound, a precursor composition for forming a silicon-containing film containing the silicon precursor compound, and a method of forming a silicon-containing film using the precursor composition.

To solve the problems described above, the present disclosure provides a method of forming a film using a silicon precursor compound, capable of depositing a silicon-containing oxide film or thin film or nitride film or thin film by atomic layer deposition by using a silicon precursor compound that has a high volatility and exists in a liquid state at room temperature, and can be deposited at a low temperature. Also, the present disclosure provides a technique for capable of providing a silicon precursor compound suitable for film or thin film deposition by atomic layer deposition and safely synthesizing a precursor.

However, problems to be solved by the present disclosure are not limited to the above-described problems. Although not described herein, other problems to be solved by the present disclosure can be clearly understood by a person with ordinary skill in the art from the following description.

Means for Solving the Problems

According to a first aspect of the present disclosure, there is provided a silicon precursor compound, represented by the following Chemical Formula 1 or the following Chemical Formula 2:

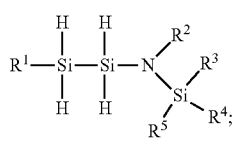

[Chemical Formula 1]

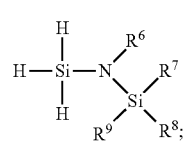

[Chemical Formula 2]

wherein, in the above Chemical Formula 1 and Chemical Formula 2, $R^1$ is hydrogen or $-NR^a R^b$, each of $R^a$ and $R^b$ is independently hydrogen, a linear or branched $C_1$-$C_5$ alkyl group, trimethylsilyl group, or dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, a trimethylsilyl group, or a dimethylsilyl group, provided that, when $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, $R^6$ is a linear or branched $C_1$-$C_5$ alkyl group, and each of $R^7$ to $R^9$ is independently hydrogen, or a linear or branched $C_1$-$C_3$ alkyl group, provided that $R^7$ to $R^9$ are not hydrogen at the same time.

According to a second aspect of the present disclosure, there is provided a method of preparing a silicon precursor compound represented by the following Chemical Formula 1, including: obtaining a reaction mixture through a halide-amine substitution reaction between M-N($R^2$)—Si$R^3R^4R^5$ and Si$X_6$ and a subsequent halide-amine substitution reaction by adding a metallic amine salt of M$R^1$; and obtaining the silicon precursor compound represented by the following Chemical Formula 1 through a halide-hydrogen substitution reaction by adding M'H into the reaction mixture:

[Chemical Formula 1]

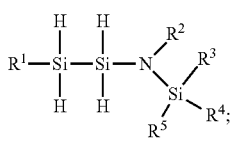

wherein, in M-N($R^2$)—Si$R^3R^4R^5$, Si$X_6$, M$R^1$, M'H and the above Chemical Formula 1, M is an alkali metal, $R^1$ is —N$R^aR^b$, each of $R^a$ and $R^b$ is independently hydrogen, a linear or branched $C_1$-$C_5$ alkyl group, trimethylsilyl group, or a dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, a trimethylsilyl group, or a dimethylsilyl group, each of $R^3$ to $R^5$ is independently hydrogen, or a linear or branched $C_1$-$C_3$ alkyl group, provided that $R^3$ to $R^5$ are not hydrogen at the same time, X is a halogen element, and M'H is a metal hydride reagent.

According to a third aspect of the present disclosure, there is provided a method of preparing a silicon precursor compound represented by the following Chemical Formula 1, including: obtaining a reaction mixture through a halide-amine substitution reaction between M-N($R^2$)—Si$R^3R^4R^5$ and Si$X_6$; and obtaining the silicon precursor compound represented by the following Chemical Formula 1 through a halide-hydrogen substitution reaction by adding M'H into the reaction mixture:

[Chemical Formula 1]

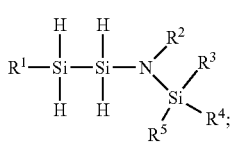

wherein, in M-N($R^2$)—Si$R^3R^4R^5$, Si$X_6$, M'H and the above Chemical Formula 1, M is an alkali metal, $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, X is a halogen element, and M'H is a metal hydride reagent.

According to a fourth aspect of the present disclosure, there is provided a method of preparing a silicon precursor compound represented by the following Chemical Formula 2, including: obtaining a reaction mixture through a halide-amine substitution reaction between M-N($R^6$)—Si$R^7R^8R^9$ and $H_y$Si$X_{(4-y)}$; and obtaining the silicon precursor compound represented by the following Chemical Formula 2 through a halide-hydrogen substitution reaction by adding M'H into the reaction mixture:

[Chemical Formula 2]

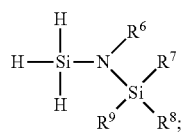

wherein, in M-N($R^6$)—Si$R^7R^8R^9$, $H_y$Si$X_{(4-y)}$, M'H and the above Chemical Formula 2, M is an alkali metal, $R^6$ is a linear or branched $C_1$-$C_5$ alkyl group, each of $R^7$ to $R^9$ is independently hydrogen, or a linear or branched $C_1$-$C_3$ alkyl group, provided that $R^7$ to $R^9$ are not hydrogen at the same time, X is a halogen element, M'H is a metal hydride reagent, and y is an integer of from 0 to 2.

According to a fifth aspect of the present disclosure, there is provided a precursor composition for forming a film, including a silicon precursor compound according to the first aspect.

According to a sixth aspect of the present disclosure, there is provided a method of forming a silicon-containing film, including forming a silicon-containing film using a precursor composition for forming a film including a silicon precursor compound according to the first aspect.

Effects of the Invention

In a method of forming a silicon-containing film using silicon precursor compounds according to embodiments of the present disclosure, it is possible to accurately control the thickness and composition while lowering the process temperature, and it is possible to form a uniform composition with excellent coverage even on a substrate having a complicated shape. Therefore, it is expected that characteristics of a semiconductor device can be improved. In particular, due to fast film growth per gas supply cycle in an atomic layer deposition method using a silicon compound of the present disclosure, it is possible to form a silicon-containing film having a required thickness with excellent step coverage in a short time.

The silicon precursor compound represented by Chemical Formula 1 or Chemical Formula 2 according to the embodiments of the present disclosure has hydrogen or various types of amines bonded to Si, easily reacts on the surface under the influence of a highly reactive amine and hydrogen having an excellent surface adsorption capacity, and reacts with a highly reactive oxidizing agent or nitriding agent, and, thus, it is advantageous for the purpose of forming a silicon-containing oxide ($SiO_2$) and nitride ($SiN_x$) thin films. Also, as the Si content in the molecule increases, the growth rate increases and the density of the film also increases, which results in improved etching characteristics. It is determined that the present deposition mechanism enables a silicon-containing film of the present disclosure to be applicable in a wide range of from about 100° C. to about 500° C. In particular, as for the silicon-containing nitride film or nitride thin film, the temperature can be lowered to about 300° C. or less. Further, since the silicon precursor compound does not have a direct carbon bond, it is possible to effectively lower the carbon content in the metal thin film. Also, the silicon precursor compound has a high volatility even at low temperatures and exists in a liquid state at room temperature so that it can be suitably used as a silicon precursor compound for depositing a silicon-containing oxide film or thin film or nitride film or thin film by atomic layer deposition.

In the embodiments described herein, as for the silicon-containing oxide film or thin film, the silicon-containing nitride film or thin film and/or the silicon-containing carbide film or thin film, the silicon-containing oxide film or thin film is used for a dielectric film, a gate insulating film, a tunneling oxide film, a spacer oxide film, ILD & IMD and/or a passivation oxide film, and the silicon-containing nitride film or thin film has been used for a diffusion mask, a gate spacer, a gate dielectric film, an etch stopper, a stressor and/or passivation and can be variously applied depending on the purpose of application, but may not be limited thereto.

In the embodiments of the present disclosure, the silicon precursor compound of the present disclosure included in the precursor composition for forming a film can be used as a precursor for atomic layer deposition or chemical vapor deposition due to its high vapor pressure, low density, and high thermal stability, and, thus, a silicon-containing film can be formed. In particular, the silicon precursor compound is highly effective in uniformly forming a silicon-containing oxide or nitride thin film having a thickness of from several nm to several μm, or from about 1 nm to about 500 nm even on a substrate having a pattern (groove) on the surface, a porous substrate, or a plastic substrate in a wide temperature range of from about 100° C. to about 500° C.

BEST MODE FOR CARRYING OUT THE INVENTION

Figure 1:
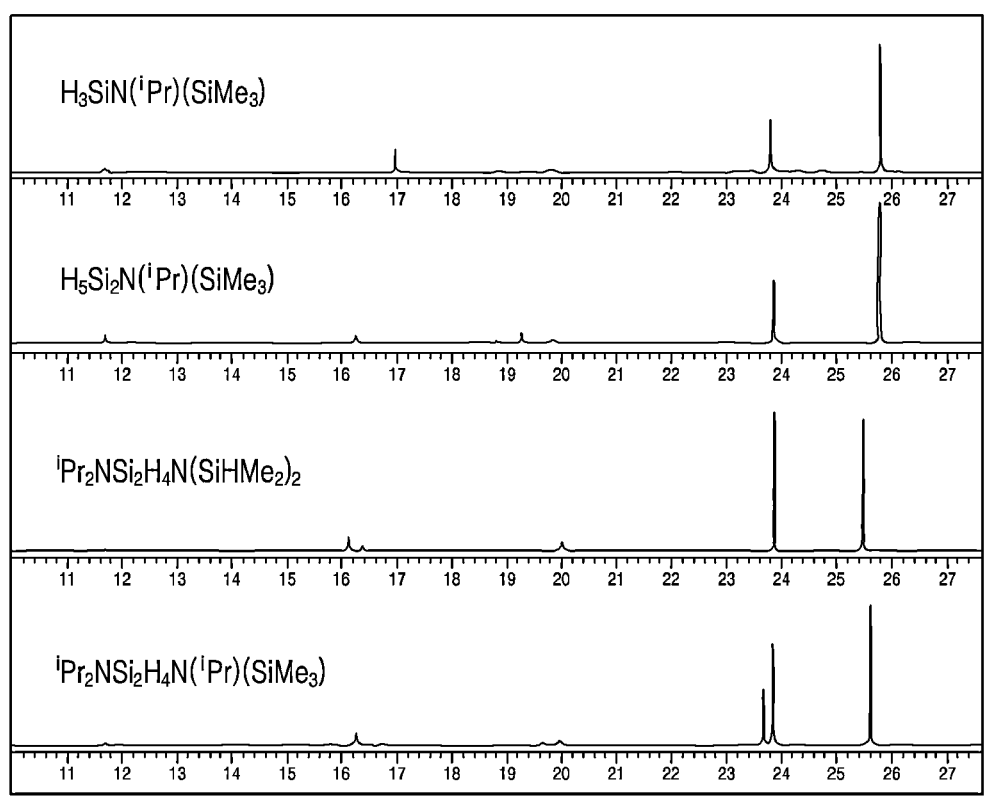
FIG. 1 shows $^1$H-NMR spectra of silicon-containing compounds prepared according to Examples 1, 3, 6 and 8 of the present disclosure.

Hereinafter, examples of the present disclosure will be described in detail with reference to the accompanying drawings so that the present disclosure may be readily implemented by a person with ordinary skill in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "film" or "thin film" refers to both "film" and "thin film" unless otherwise noted.

Through the whole document, the term "alkyl" or "alkyl group" includes a linear or branched alkyl group having 1 to 12 carbon atoms, 1 to 10 carbon atoms, 1 to 8 carbon atoms, or 1 to 5 carbon atoms and all the possible isomers thereof. For example, the alkyl or alkyl group may include a methyl group (Me), an ethyl group (Et), a n-propyl group ($^n$Pr), an iso-propyl group ($^i$Pr), a n-butyl group ($^n$Bu), an iso-butyl group ($^i$Bu), a tert-butyl group ($^t$Bu), a sec-butyl group ($^{sec}$Bu), a n-pentyl group ($^n$Pe), an iso-pentyl group ($^{iso}$Pe), a sec-pentyl group ($^{sec}$Pe), a tert-pentyl group ($^t$Pe), a neo-pentyl group ($^{neo}$Pe), a 3-pentyl group, a n-hexyl group, an iso-hexyl group, a heptyl group, a 4,4-dimethyl pentyl group, an octyl group, a 2,2,4-trimethyl pentyl group, a nonyl group, a decyl group, an undecyl group, a dodecyl group, and isomers thereof, but may not be limited thereto.

Hereinafter, embodiments of the present disclosure have been described in detail, but the present disclosure may not be limited thereto.

According to a first aspect of the present disclosure, there is provided a silicon precursor compound, represented by the following Chemical Formula 1 or the following Chemical Formula 2:

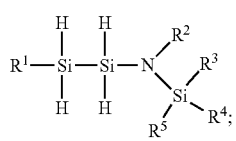

[Chemical Formula 1]

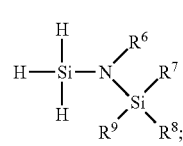

[Chemical Formula 2]

wherein, in the above Chemical Formula 1 and Chemical Formula 2, $R^1$ is hydrogen or $-NR^aR^b$, each of $R^a$ and $R^b$ is independently hydrogen, a linear or branched $C_1$-$C_5$ alkyl group, trimethylsilyl group, or dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, a trimethylsilyl group, or a dimethylsilyl group, provided that, when $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, $R^6$ is a linear or branched $C_1$-$C_5$ alkyl group, and each of $R^7$ to $R^9$ is independently hydrogen, or a linear or branched $C_1$-$C_3$ alkyl group, provided that $R^7$ to $R^9$ are not hydrogen at the same time.

In an embodiment of the present disclosure, in the above Chemical Formula 1, $R^1$ may be $-NR^aR^b$, and each of $R^a$ and $R^b$ may be independently hydrogen, a methyl group, an ethyl group, an n-propyl group, an iso-propyl group, an n-butyl group, an iso-butyl group, a sec-butyl group, a tert-butyl group, a dimethylsilyl group, or a trimethylsilyl group; or $R^1$ may be a substituted or unsubstituted $C_4$-$C_{10}$ cyclic amine group, $R^2$ may be a methyl group, an ethyl group, an n-propyl group, an iso-propyl group, an n-butyl group, an iso-butyl group, a sec-butyl group, a tert-butyl group, a trimethylsilyl group, or a dimethylsilyl group, and $-SiR^3R^4R^5$ may be a dimethylsilyl group or a trimethylsilyl group, but may not be limited thereto.

In an embodiment of the present disclosure, in the above Chemical Formula 1, $R^1$ may be Me$_2$N—, EtMeN—, Me$^n$-PrN—, Me$^i$PrN—, Me$^n$BuN—, Et$_2$N—, Et$^n$PrN—, Et$^i$PrN—, $^n$Pr$_2$N—, $^i$Pr$_2$N—, $^i$Pr$^n$BuN—, $^n$Bu$_2$N—, $^{sec}$Bu$_2$N—, EtHN—, $^i$PrHN—, $^t$BuHN—, C$_4$H$_8$N—, C$_5$H$_{10}$N—, C$_6$H$_{12}$N—, C$_7$H$_{14}$N—, C$_8$H$_{16}$N—, C$_9$H$_{18}$N—, C$_{10}$H$_{20}$N—, (Me)(SiMe$_3$)N—, ($^i$Pr)(SiMe$_3$)N—, or (Me$_2$SiH)$_2$N—, $R^2$ may be a methyl group, an ethyl group, an n-propyl group, an iso-propyl group, an n-butyl group, an iso-butyl group, a sec-butyl group, a tert-butyl group, a trimethylsilyl group, or a dimethylsilyl group, and $-SiR^3R^4R^5$ may be a dimethylsilyl group or a trimethylsilyl group, but may not be limited thereto. For example, $R^1$ may be a cyclic substituent as follows, but may not be limited thereto:

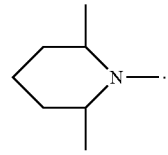

In an embodiment of the present disclosure, in the above Chemical Formula 1, $R^1$ may be hydrogen, $R^2$ may be a methyl group, an ethyl group, an n-propyl group, an iso-propyl group, an n-butyl group, an iso-butyl group, a sec-butyl group, or a tert-butyl group, and $-SiR^3R^4R^5$ may be a dimethylsilyl group or a trimethylsilyl group, but may not be limited thereto.

In an embodiment of the present disclosure, the silicon precursor compound represented by the above Chemical Formula 1 may include compounds described below, but may not be limited thereto:

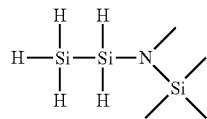

COMPOUND 1

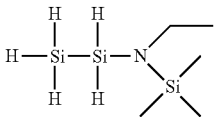

COMPOUND 2

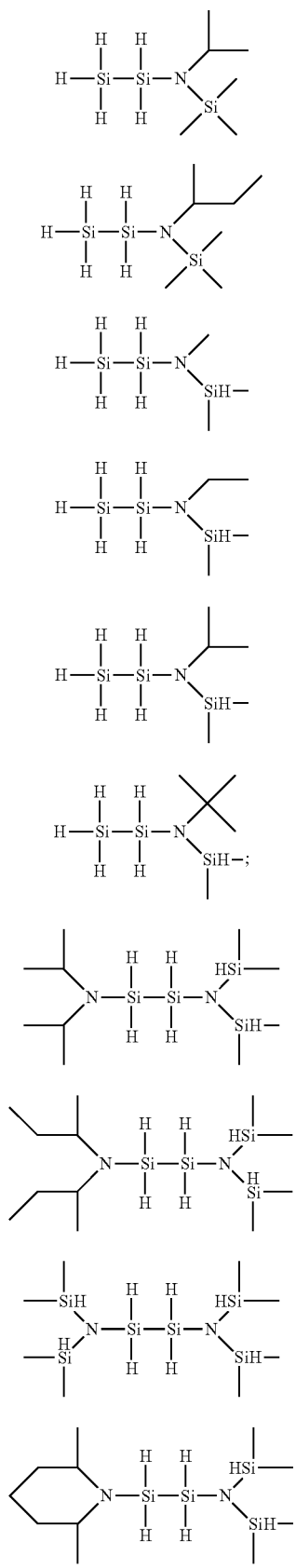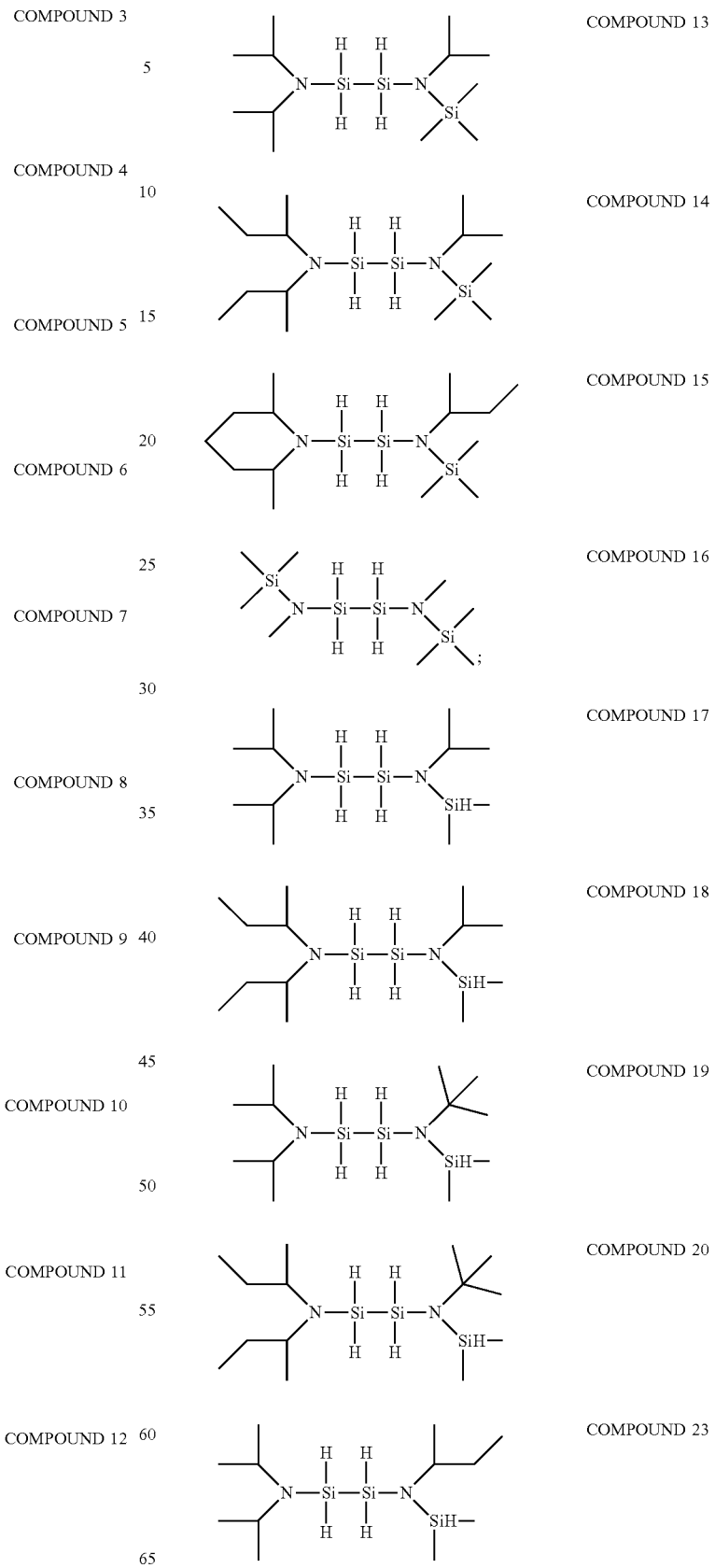

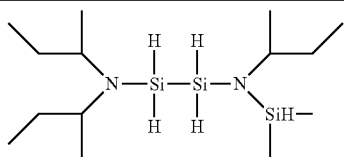

COMPOUND 24

In an embodiment of the present disclosure, the silicon precursor compound represented by the above Chemical Formula 1 may be $^{i}Pr_2NSi_2H_4N(SiHMe_2)_2$, $^{sec}Bu_2NSi_2H_4N(SiHMe_2)_2$, $^{i}Pr_2NSi_2H_4N(^{i}Pr)(SiMe_3)$, $^{sec}Bu_2NSi_2H_4N(^{i}Pr)(SiMe_3)$, $(Me_2SiH)_2NSi_2H_4N(SiHMe_2)_2$, $H_5Si_2N(^{i}Pr)(SiMe_3)$, or $H_5Si_2N(^{sec}Bu)(SiMe_3)$.

In an embodiment of the present disclosure, in the above Chemical Formula 2, $R^6$ may be a methyl group, an ethyl group, an n-propyl group, an iso-propyl group, an n-butyl group, an iso-butyl group, a sec-butyl group, or a tert-butyl group, and —$SiR^7R^8R^9$ may be a dimethylsilyl group or a trimethylsilyl group, but may not be limited thereto.

In an embodiment of the present disclosure, the silicon precursor compound represented by the above Chemical Formula 1 may include compounds described below, but may not be limited thereto:

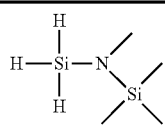

COMPOUND 25

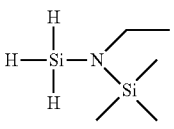

COMPOUND 26

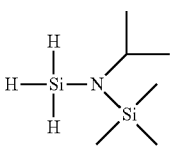

COMPOUND 27

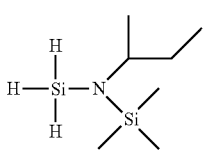

COMPOUND 28

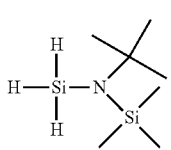

COMPOUND 29

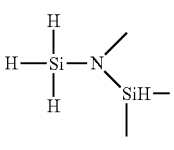

COMPOUND 30

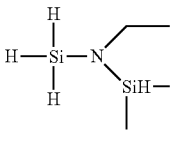

COMPOUND 31

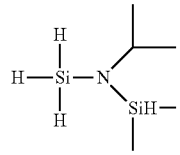

COMPOUND 32

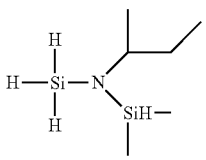

COMPOUND 33

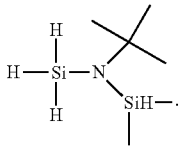

COMPOUND 34

In an embodiment of the present disclosure, the silicon precursor compound represented by the above Chemical Formula 2 may be $H_3SiN(^{i}Pr)(SiMe_3)$ or $H_3SiN(^{sec}Bu)(SiMe_3)$.

The silicon precursor compound represented by Chemical Formula 1 or Chemical Formula 2 according to the embodiments of the present disclosure has hydrogen or various types of amines bonded to Si, easily reacts on the surface under the influence of a highly reactive amine and hydrogen having an excellent surface adsorption capacity, and reacts with a highly reactive oxidizing agent or nitriding agent, and, thus, it is advantageous for the purpose of forming a silicon-containing oxide ($SiO_2$) and nitride ($SiNx$) thin films. Also, as the Si content in the molecule increases, the growth rate increases and the density of the film also increases, which results in improved etching characteristics. It is determined that the present deposition mechanism enables a silicon-containing film of the present disclosure to be applicable in a wide range of from about 100° C. to about 500° C. In particular, as for the silicon-containing nitride film or nitride thin film, the temperature can be lowered to about 300° C. or less. Further, since the silicon precursor compound does not have a direct carbon bond, it is possible to effectively lower the carbon content in the metal thin film. Also, the silicon precursor compound has a high volatility even at low temperatures and exists in a liquid state at room temperature so that it can be suitably used as a silicon precursor compound for depositing a silicon-containing oxide film or thin film or nitride film or thin film by atomic layer deposition.

According to a second aspect of the present disclosure, there is provided a method of preparing a silicon precursor compound represented by the following Chemical Formula 1, including: obtaining a reaction mixture through a halide-amine substitution reaction between M-N($R^2$)—$SiR^3R^4R^5$ and $SiX_6$ and a subsequent halide-amine substitution reaction by adding a metallic amine salt of $MR^1$; and obtaining the silicon precursor compound represented by the following Chemical Formula 1 through a halide-hydrogen substitution reaction by adding M'H into the reaction mixture:

[Chemical Formula 1]

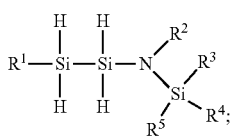

wherein, in M-N(R$^2$)—SiR$^3$R$^4$R$^5$, SiX$_6$, MR$^1$, M'H and the above Chemical Formula 1, M is an alkali metal, R$^1$ is —NR$^a$R$^b$, each of R$^a$ and R$^b$ is independently hydrogen, a linear or branched C$_1$-C$_5$ alkyl group, trimethylsilyl group, or a dimethylsilyl group, or R$^a$ and R$^b$ are a substituted or unsubstituted C$_4$-C$_{10}$ cyclic alkyl group linked to each other, provided that R$^a$ and R$^b$ are not hydrogen at the same time, R$^2$ is a linear or branched C$_1$-C$_5$ alkyl group, a trimethylsilyl group, or a dimethylsilyl group, each of R$^3$ to R$^5$ is independently hydrogen, or a linear or branched C$_1$-C$_3$ alkyl group, provided that R$^3$ to R$^5$ are not hydrogen at the same time, X is a halogen element, and M'H is a metal hydride reagent.

Detailed descriptions of the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, the silicon precursor compound represented by the above Chemical Formula 1 may be prepared by using various methods, and desirably obtained by selectively substituting an amine ligand in a nonpolar solvent and hyriding with a solvent mixture of polar and nonpolar solvents, followed by purification according to the following Reaction Formula 1, but may not be limited thereto:

Step 1: Si$_2$X$_6$+M-N(R$^2$)—SiR$^3$R$^4$R$^5$→Si$_2$X$_5$N(R$^2$)—SiR$^3$R$^4$R$^5$+MX

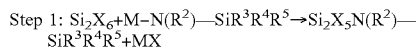

Step 2: Si$_2$X$_5$N(R$^2$)—SiR$^3$R$^4$R$^5$+MR$^1$→R$^1$Si$_2$X$_4$N(R$^2$)—SiR$^3$R$^4$R$^5$+MX

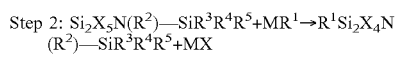

Step 3: R$^1$Si$_2$X$_4$N(R$^2$)—SiR$^3$R$^4$R$^5$+ 4M'H→R$^1$Si$_2$H$_4$N(R$^2$R$^3$)+4M'X

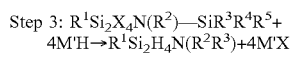

[Reaction Formula 1]

Herein, M is an alkali metal and may be Li or Na, and M'H is a metal hydride reagent and may be LiH, NaH, LiBH$_4$, LiAlH$_4$, NaAlH$_4$, or NaBH$_4$, but may not be limited thereto.

In an embodiment of the present disclosure, the silicon precursor compound represented by the above Chemical Formula 1 can be easily obtained by adding a metallic amine salt [M-N(R$^2$)—SiR$^3$R$^4$R$^5$, M:Li or Na] having an equivalent of about 1 into disilicon hexahalide at a low temperature, making a substitution reaction between halide and amine while maintaining room temperature, and removing a reaction by-product in the form of a metallic halide salt through a filter in a primary reaction, and then, adding a metallic amine salt (MR$^1$) having an equivalent of about 1 at room temperature, making a substitution reaction between halide and amine while maintaining room temperature, and removing a reaction by-product in the form of a metallic halide salt through a filter in a secondary reaction, and then, substituting remaining halide with hydrogen by using M'H in a tertiary reaction as shown in the above Reaction Formula 1. Also, in the primary reaction of the above Reaction Formula 1, it is desirable to select a method of adding a metallic amine salt [M-N(R$^2$)—SiR$^3$R$^4$R$^5$, M:Li or Na] having an equivalent of about 1 at a low temperature, a method of adding an amine (HN(R$^2$)—SiR$^3$R$^4$R$^5$) having an equivalent of about 2, or a method of adding tetraethylamine (TEA) having an equivalent of about 1 to 1.5 and amine [HN(R$^2$R$^3$)]. Further, in the secondary reaction of the above Reaction Formula 1, it is desirable to select a method of adding a metallic amine salt (MNR$^a$R$^b$) having an equivalent of about 1 at a low temperature, a method of adding an amine (HNR$^a$R$^b$) having an equivalent of about 2, or a method of adding tetraethylamine (TEA) having an equivalent of about 1 to 1.5 and amine (HR$^1$, R$^1$=N(R$^a$R$^b$)). However, the present disclosure may not be limited thereto.

In an embodiment of the present disclosure, in the above Reaction Formula 1, X is a halogen element such as Cl, Br, or I, and may be desirably Cl, but may not be limited thereto.

In an embodiment of the present disclosure, in the above Reaction Formula 1, M'H is a reducing agent that reduces X to hydrogen and includes at least one selected from lithium hydride (LiH), sodium hydride (NaH$_4$), lithium borohydride (LiBH$_4$), sodium borohydride (NaBH$_4$), lithium aluminum hydride (LiAlH$_4$), or sodium aluminum hydride (NaAlH$_4$). Desirably, M'H is LiAlH$_4$. However, the present disclosure may not be limited thereto.

In an embodiment of the present disclosure, in the above Chemical Formula 1, R$^1$ may be —NR$^a$R$^b$, each of R$^a$ and R$^b$ may be independently hydrogen, a methyl group, an ethyl group, an n-propyl group, an iso-propyl group, an n-butyl group, an iso-butyl group, a sec-butyl group, a tert-butyl group, a dimethylsilyl group, or a trimethylsilyl group; or R$^1$ may be a substituted or unsubstituted C$_4$-C$_{10}$ cyclic amine group, R$^2$ may be a methyl group, an ethyl group, an n-propyl group, an iso-propyl group, an n-butyl group, an iso-butyl group, a sec-butyl group, a tert-butyl group, a trimethylsilyl group, or a dimethylsilyl group, and —SiR$^3$R$^4$R$^5$ may be a dimethylsilyl group or a trimethylsilyl group, but may not be limited thereto.

In an embodiment of the present disclosure, in the above Chemical Formula 1, R$^1$ may be Me$_2$N—, EtMeN—, Me$^n$-PrN—, Me$^i$PrN—, Me$^n$BuN—, Et$_2$N—, Et$^n$PrN—, Et$^i$PrN—, $^n$Pr$_2$N—, $^i$Pr$_2$N—, $^i$Pr$^n$BuN—, $^n$Bu$_2$N—, $^{sec}$Bu$_2$N—, EtHN—, $^i$PrHN—, $^t$BuHN—, C$_4$H$_8$N—, C$_5$H$_{10}$N—, C$_6$H$_{12}$N—, C$_7$H$_{14}$N— (for example,

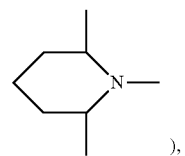

),

C$_8$H$_{16}$N—, C$_9$H$_{18}$N—, C$_{10}$H$_{20}$N—, (Me)(SiMe$_3$)N—, ($^i$Pr)(SiMe$_3$)N—, or (Me$_2$SiH)$_2$N—, R$^2$ may be a methyl group, an ethyl group, an n-propyl group, an iso-propyl group, an n-butyl group, an iso-butyl group, a sec-butyl group, a tert-butyl group, a trimethylsilyl group, or a dimethylsilyl group, and —SiR$^3$R$^4$R$^5$ may be a dimethylsilyl group or a trimethylsilyl group, but may not be limited thereto.

In an embodiment of the present disclosure, a solvent used in step 1 and step 2 of the above Reaction Formula 1 may be a nonpolar solvent. For example, alkanes having 5 to 8 carbon atoms, such as pentane, hexane, octane, etc., or toluene with weak polarity may be used as the solvent. Desirably, hexane may be used, but the present disclosure may not be limited thereto. Further, a solvent in step 3 of the above Reaction Formula 1 may be desirably a solvent mixture of polar and nonpolar solvents mixed at a predetermined ratio. A ratio of the nonpolar solvent to the polar solvent may be, desirably, about 2:about 1 to about 4 depending on the structure of a material to be reduced, but may not be limited thereto. Here, the polar solvent may be selected from THF, ether, and mono- to tetra-glymes. Desirably, THF or ether may be used. Further, the nonpolar solvent may be selected from alkanes having 5 to 8 carbon atoms, such as pentane, hexane, octane, etc. Desirably, hexane may be used, but the present disclosure may not be limited thereto.

According to a third aspect of the present disclosure, there is provided a method of preparing a silicon precursor compound represented by the following Chemical Formula 1, including: obtaining a reaction mixture through a halide-amine substitution reaction between $M-N(R^2)$—$SiR^3R^4R^5$ and $SiX_6$; and obtaining the silicon precursor compound represented by the following Chemical Formula 1 through a halide-hydrogen substitution reaction by adding M'H into the reaction mixture:

[Chemical Formula 1]

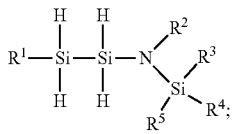

wherein, in $M-N(R^2)$—$SiR^3R^4R^5$, $SiX_6$, M'H and the above Chemical Formula 1, M is an alkali metal, $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, X is a halogen element, and M'H is a metal hydride reagent.

Detailed descriptions of the third aspect of the present disclosure, which overlap with those of the first aspect and the second aspect of the present disclosure, are omitted hereinafter, but the descriptions of the first aspect and the second aspect of the present disclosure may be identically applied to the third aspect of the present disclosure, even though they are omitted hereinafter.

In an embodiment of the present disclosure, the silicon precursor compound represented by the above Chemical Formula 2 may be prepared by using various methods, and desirably obtained by selectively substituting an amine ligand in a nonpolar solvent and hydriding with a solvent mixture of polar and nonpolar solvents, followed by purification according to the following Reaction Formula 2, but may not be limited thereto:

Step 1: 

Step 2: 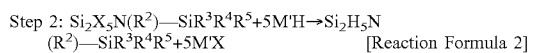 [Reaction Formula 2]

Herein, M is an alkali metal and may be Li or Na, and M'H is a metal hydride reagent and may be LiH, NaH, LiBH$_4$, LiAlH$_4$, NaAlH$_4$, or NaBH$_4$, but may not be limited thereto.

In an embodiment of the present disclosure, the silicon precursor compound represented by the above Chemical Formula 1 can be easily obtained by adding a metallic amine salt [$M-N(R^2R^3)$, M:Li or Na] having an equivalent of about 1 into disilicon hexahalide at a low temperature, making a substitution reaction between halide and amine while maintaining room temperature, and removing a reaction by-product in the form of a metallic halide salt through a filter in a primary reaction, and then, substituting remaining halide with hydrogen by using M'H in a secondary reaction as shown in the above Reaction Formula 2. Also, in the primary reaction of the above Reaction Formula 2, it is desirable to select a method of adding a metallic amine salt [$M-N(R^2R^3)$, M:Li, Na] having an equivalent of about 1 at a low temperature, a method of adding an amine [$HN(R^2R^3)$] having an equivalent of about 2, or a method of adding tetraethylamine (TEA) having an equivalent of about 1 to 1.5 and amine [$HN(R^2R^3)$]. However, the present disclosure may not be limited thereto.

In an embodiment of the present disclosure, in the above Reaction Formula 2, X is a halogen element such as Cl, Br, or I, and may be desirably Cl, but may not be limited thereto.

In an embodiment of the present disclosure, in the above Reaction Formula 2, M'H is a reducing agent that reduces X to hydrogen and includes at least one selected from lithium hydride (LiH), sodium hydride (NaH$_4$), lithium borohydride (LiBH$_4$), sodium borohydride (NaBH$_4$), lithium aluminum hydride (LiAlH$_4$), or sodium aluminum hydride (NaAlH$_4$). Desirably, M'H is LiAlH$_4$. However, the present disclosure may not be limited thereto.

In an embodiment of the present disclosure, $R^2$ may be a methyl group, an ethyl group, an n-propyl group, an iso-propyl group, an n-butyl group, an iso-butyl group, a sec-butyl group or a tert-butyl group, and —$SiR^3R^4R^5$ may be a dimethylsilyl group or a trimethylsilyl group, but may not be limited thereto.

In an embodiment of the present disclosure, a solvent used in step 1 of the above Reaction Formula 2 may be a nonpolar solvent. For example, alkanes having 5 to 8 carbon atoms, such as pentane, hexane, octane, etc., or toluene with weak polarity may be used as the solvent. Desirably, hexane may be used, but the present disclosure may not be limited thereto. Further, a solvent in step 2 of the above Reaction Formula 2 may be desirably a solvent mixture of polar and nonpolar solvents mixed at a predetermined ratio. A ratio of the nonpolar solvent to the polar solvent may be, desirably, about 2:about 1 to about 4 depending on the structure of a material to be reduced, but may not be limited thereto. Here, the polar solvent may be selected from THF, ether, and mono- to tetra-glymes. Desirably, THF or ether may be used. Further, the nonpolar solvent may be selected from alkanes having 5 to 8 carbon atoms, such as pentane, hexane, octane, etc. Desirably, hexane may be used, but the present disclosure may not be limited thereto.

According to a fourth aspect of the present disclosure, there is provided a method of preparing a silicon precursor compound represented by the following Chemical Formula 2, including: obtaining a reaction mixture through a halide-amine substitution reaction between $M-N(R^6)$—$SiR^7R^8R^9$ and $H_ySiX_{(4-y)}$; and obtaining the silicon precursor compound represented by the following Chemical Formula 2 through a halide-hydrogen substitution reaction by adding M'H into the reaction mixture:

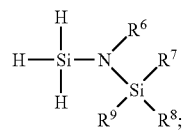

[Chemical Formula 2]

wherein, in M-N(R$^6$)—SiR$^7$R$^8$R$^9$, H$_y$SiX$_{(4-y)}$, M'H and the above Chemical Formula 2, M is an alkali metal, R$^6$ is a linear or branched C$_1$-C$_5$ alkyl group, each of R$^7$ to R$^9$ is independently hydrogen, or a linear or branched C$_1$-C$_3$ alkyl group, provided that R$^7$ to R$^9$ are not hydrogen at the same time, X is a halogen element, M'H is a metal hydride reagent, and y is an integer of from 0 to 2.

Detailed descriptions of the fourth aspect of the present disclosure, which overlap with those of the first aspect and the third aspect of the present disclosure, are omitted hereinafter, but the descriptions of the first aspect and the third aspect of the present disclosure may be identically applied to the fourth aspect of the present disclosure, even though they are omitted hereinafter.

In an embodiment of the present disclosure, the silicon precursor compound represented by the above Chemical Formula 2 may be prepared by using various methods, and desirably obtained by selectively substituting an amine ligand in a nonpolar solvent and hydriding with a solvent mixture of polar and nonpolar solvents, followed by purification according to the following Reaction Formula 3, but may not be limited thereto:

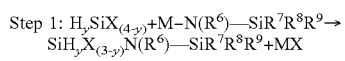

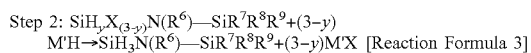 [Reaction Formula 3]

Herein, M is an alkali metal and may be Li or Na, and M'H is a metal hydride reagent and may be LiH, NaH, LiBH$_4$, LiAlH$_4$, NaAlH$_4$, or NaBH$_4$, but may not be limited thereto.

In an embodiment of the present disclosure, the silicon precursor compound represented by the above Chemical Formula 2 can be easily obtained by adding a metallic amine salt (M-N(R$^6$)—SiR$^7$R$^8$R$^9$, M:Li or Na) having an equivalent of about 1 into di- to tetra-halide silicon compound at a low temperature, making a substitution reaction between halide and amine while maintaining room temperature, and removing a reaction by-product in the form of a metallic halide salt through a filter in a primary reaction, and then, substituting remaining halide with hydrogen by using M'H in a secondary reaction as shown in the above Reaction Formula 3. Also, in the primary reaction of the above Reaction Formula 3, it is desirable to select a method of adding a metallic amine salt [M-N(R$^6$)—SiR$^7$R$^8$R$^9$] having an equivalent of about 1 at a low temperature, a method of adding an amine [HN(R$^6$)—SiR$^7$R$^8$R$^9$] having an equivalent of about 2, or a method of adding tetraethylamine (TEA) having an equivalent of about 1 to 1.5 and amine [HN(R$^6$)—SiR$^7$R$^8$R$^9$]. However, the present disclosure may not be limited thereto.

In an embodiment of the present disclosure, in the above Reaction Formula 3, X is a halogen element such as Cl, Br, or I, and may be desirably Cl, but may not be limited thereto.

In an embodiment of the present disclosure, in the above Reaction Formula 3, M'H is a reducing agent that reduces X to hydrogen and includes at least one selected from lithium hydride (LiH), sodium hydride (NaH$_4$), lithium borohydride (LiBH$_4$), sodium borohydride (NaBH$_4$), lithium aluminum hydride (LiAlH$_4$), or sodium aluminum hydride (NaAlH$_4$). Desirably, M'H is LiAlH$_4$. However, the present disclosure may not be limited thereto.

In an embodiment of the present disclosure, in the above Chemical Formula 2, R$^6$ may be a methyl group, an ethyl group, an n-propyl group, an iso-propyl group, an n-butyl group, an iso-butyl group, a sec-butyl group or a tert-butyl group, and —SiR$^7$R$^8$R$^9$ may be a dimethylsilyl group or a trimethylsilyl group, but may not be limited thereto.

In an embodiment of the present disclosure, a solvent used in step 1 of the above Reaction Formula 3 may be a nonpolar solvent. For example, alkanes having 5 to 8 carbon atoms, such as pentane, hexane, octane, etc., or toluene with weak polarity may be used as the solvent. Desirably, hexane may be used, but the present disclosure may not be limited thereto. Further, a solvent in step 2 of the above Reaction Formula 3 may be desirably a solvent mixture of polar and nonpolar solvents mixed at a predetermined ratio. A ratio of the nonpolar solvent to the polar solvent may be, desirably, about 2:about 1 to about 4 depending on the structure of a material to be reduced, but may not be limited thereto. Here, the polar solvent may be selected from THF, ether, and mono- to tetra-glymes. Desirably, THF or ether may be used. Further, the nonpolar solvent may be selected from alkanes having 5 to 8 carbon atoms, such as pentane, hexane, octane, etc. Desirably, hexane may be used, but the present disclosure may not be limited thereto.

According to a fifth aspect of the present disclosure, there is provided a precursor composition for forming a film, including a silicon precursor compound according to the first aspect.

Detailed descriptions of the fifth aspect of the present disclosure, which overlap with those of the first aspect and the fourth aspect of the present disclosure, are omitted hereinafter, but the descriptions of the first aspect and the fourth aspect of the present disclosure may be identically applied to the fifth aspect of the present disclosure, even though they are omitted hereinafter.

In an embodiment of the present disclosure, the precursor composition for forming a film includes a silicon precursor compound, represented by the following Chemical Formula 1 or the following Chemical Formula 2:

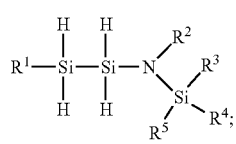

[Chemical Formula 1]

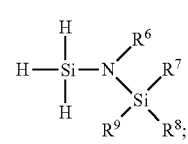

[Chemical Formula 2]

wherein, in the above Chemical Formula 1 and Chemical Formula 2,

R$^1$ is hydrogen or —NR$^a$R$^b$, each of $R^a$ and $R^b$ is independently hydrogen, a linear or branched $C_1$-$C_5$ alkyl group, trimethylsilyl group, or dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, a trimethylsilyl group, or a dimethylsilyl group, provided that, when $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, $R^6$ is a linear or branched $C_1$-$C_5$ alkyl group, and each of $R^7$ to $R^9$ is independently hydrogen, or a linear or branched $C_1$-$C_3$ alkyl group, provided that $R^7$ to $R^9$ are not hydrogen at the same time.

In an embodiment of the present disclosure, the silicon precursor compound may be at least one selected from $^iPr_2NSi_2H_4N(SiHMe_2)_2$, $^{sec}Bu_2NSi_2H_4N(SiHMe_2)_2$, $^iPr_2NSi_2H_4N(^iPr)(SiMe_3)$, $^{sec}Bu_2NSi_2H_4N(^iPr)(SiMe_3)$, $(Me_2SiH)_2NSi_2H_4N(SiHMe_2)_2$, $H_5Si_2N(^iPr)(^{SiMe}_3)$, $H_5Si_2N(^{sec}Bu)(SiMe_3)$, $H_3SiN(^iPr)(SiMe_3)$, and $H_3SiN(^{sec}Bu)(SiMe_3)$.

In an embodiment of the present disclosure, the film may be at least one selected from a silicon-containing oxide film or thin film, a silicon-containing nitride film or thin film, and a silicon-containing carbide film or thin film, but may not be limited thereto.

In an embodiment of the present disclosure, the precursor composition for forming a film may further include at least one nitrogen source selected from ammonia, nitrogen, hydrazine, and dimethyl hydrazine, but may not be limited thereto.

In an embodiment of the present disclosure, the precursor composition for forming a film may further include at least one oxygen source selected from water vapor, oxygen, and ozone, but may not be limited thereto.

According to a sixth aspect of the present disclosure, there is provided a method of forming a silicon-containing film, including forming a silicon-containing film using a precursor composition for forming a film including a silicon precursor compound according to the first aspect.

Detailed descriptions of the sixth aspect of the present disclosure, which overlap with those of the first aspect and the fifth aspect of the present disclosure, are omitted hereinafter, but the descriptions of the first aspect and the fifth aspect of the present disclosure may be identically applied to the sixth aspect of the present disclosure, even though they are omitted hereinafter.

In an embodiment of the present disclosure, the precursor composition for forming a film includes a silicon precursor compound, represented by the following Chemical Formula 1 or the following Chemical Formula 2:

[Chemical Formula 1]

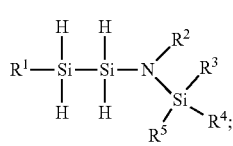

[Chemical Formula 2]

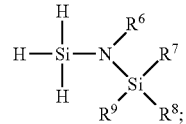

wherein, in the above Chemical Formula 1 and Chemical Formula 2, $R^1$ is hydrogen or $-NR^aR^b$, each of $R^a$ and $R^b$ is independently hydrogen, a linear or branched $C_1$-$C_5$ alkyl group, trimethylsilyl group, or dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, a trimethylsilyl group, or a dimethylsilyl group, provided that, when $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, $R^6$ is a linear or branched $C_1$-$C_5$ alkyl group, and each of $R^7$ to $R^9$ is independently hydrogen, or a linear or branched $C_1$-$C_3$ alkyl group, provided that $R^7$ to $R^9$ are not hydrogen at the same time.

In an embodiment of the present disclosure, the silicon precursor compound included in the precursor composition for forming a film may be at least one selected from $^iPr_2NSi_2H_4N(SiHMe_2)_2$, $^{sec}Bu_2NSi_2H_4N(SiHMe_2)_2$, $^iPr_2NSi_2H_4N(^iPr)(SiMe_3)$, $^{sec}Bu_2NSi_2H_4N(^iPr)(SiMe_3)$, $(Me_2SiH)_2NSi_2H_4N(SiHMe_2)_2$, $H_3Si_2N(^iPr)(SiMe_3)$, $H_5Si_2N(^{sec}Bu)(SiMe_3)$, $H_3SiN(^iPr)(SiMe_3)$, and $H_3SiN(^{sec}Bu)(SiMe_3)$, but may not be limited thereto.

In an embodiment of the present disclosure, the silicon-containing film may be at least one selected from a silicon-containing oxide film or thin film, a silicon-containing nitride film or thin film, and a silicon-containing carbide film or thin film, but may not be limited thereto.

In the embodiments described herein, as for the silicon-containing oxide film or thin film, the silicon-containing nitride film or thin film and/or the silicon-containing carbide film or thin film, the silicon-containing oxide film or thin film is used for a dielectric film, a gate insulating film, a tunneling oxide film, a spacer oxide film, ILD & IMD and/or a passivation oxide film, and the silicon-containing nitride film or thin film has been used for a diffusion mask, a gate spacer, a gate dielectric film, an etch stopper, a stressor and/or passivation, and can be variously applied depending on the purpose of application, but may not be limited thereto.

In an embodiment of the present disclosure, the silicon-containing film may be deposited by chemical vapor deposition (CVD) or atomic layer deposition (ALD), but may not be limited thereto. The silicon-containing film may be deposited by metal organic chemical vapor deposition (MOCVD) or atomic layer deposition (ALD), but may not be limited thereto. Further, the chemical vapor deposition or the atomic layer deposition may be performed using a deposition apparatus known in the art, deposition conditions, and an additional reaction gas, but may not be limited thereto.

In an embodiment of the present disclosure, desirably, at least one of water vapor ($H_2O$), oxygen ($O_2$), oxygen plasma ($O_2$ Plasma), nitrogen oxides (NO, $N_2O$), nitrogen oxide plasma ($N_2O$ Plasma), oxygen nitride ($N_2O_2$), hydrogen peroxide ($H_2O_2$), and ozone ($O_3$) may be used as a reaction gas to form a silicon-containing oxide film or a complex metal silicon-containing oxide film (HfSiOx, ZrSiOx, TiSiOx, HfAlOx, ZrAlSiOx, TiAlSiOx, ZrHfSiOx, ZrHfAlSiOx, SiC, SiCO, or SiON) when the film is deposited.

In an embodiment of the present disclosure, desirably, at least one of ammonia ($NH_3$), ammonia plasma ($NH_3$ Plasma), hydrazine ($N_2H_4$), and nitrogen plasma ($N_2$ Plasma) may be used as a reaction gas to form a silicon-containing nitride film (SiN) or a complex metal nitride film (HfSiNx, ZrSiNx, TiSiNx, AlSiNx, HfAlSiNx, ZrAlSiNx, TiAlSiNx, HfZrAlSiNx, HfZrTiSiNx, TiAlSiNx, SiCN, SiOCN, or SiBN) when the film is deposited.

In an embodiment of the present disclosure, the silicon-containing film may be formed in a temperature range of from about 100° C. to about 500° C., but may not be limited thereto. For example, the silicon-containing film may be formed in a temperature range of from about 100° C. to about 500° C., from about 100° C. to about 450° C., from about 100° C. to about 400° C., from about 100° C. to about 350° C., from about 100° C. to about 300° C., from about 100° C. to about 250° C., from about 100° C. to about 200° C., from about 100° C. to about 150° C., from about 150° C. to about 500° C., from about 150° C. to about 450° C., from about 150° C. to about 400° C., from about 150° C. to about 350° C., from about 150° C. to about 300° C., from about 150° C. to about 250° C., from about 150° C. to about 200° C., from about 200° C. to about 500° C., from about 200° C. to about 450° C., from about 200° C. to about 400° C., from about 200° C. to about 350° C., from about 200° C. to about 300° C., from about 200° C. to about 250° C., from about 250° C. to about 500° C., from about 250° C. to about 450° C., from about 250° C. to about 400° C., from about 250° C. to about 350° C., from about 250° C. to about 300° C., from about 300° C. to about 500° C., from about 300° C. to about 450° C., from about 300° C. to about 400° C., from about 300° C. to about 350° C., from about 350° C. to about 500° C., from about 350° C. to about 450° C., from about 350° C. to about 400° C., from about 400° C. to about 500° C., from about 400° C. to about 450° C., or from about 450° C. to about 500° C., but may not be limited thereto.

In an embodiment of the present disclosure, the silicon-containing film may be formed in a thickness range of from about 1 nm to about 500 nm and can be variously applied depending on the purpose of application, but may not be limited thereto. For example, the silicon-containing film may be formed in a thickness range of from about 1 nm to about 500 nm, from about 1 nm to about 400 nm, from about 1 nm to about 300 nm, from about 1 nm to about 200 nm, from about 1 nm to about 100 nm, from about 1 nm to about 50 nm, from about 1 nm to about 40 nm, from about 1 nm to about 30 nm, from about 1 nm to about 20 nm, from about 1 nm to about 10 nm, from about 10 nm to about 500 nm, from about 10 nm to about 400 nm, from about 10 nm to about 300 nm, from about 10 nm to about 200 nm, from about 10 nm to about 100 nm, from about 10 nm to about 50 nm, from about 10 nm to about 40 nm, from about 10 nm to about 30 nm, from about 10 nm to about 20 nm, from about 20 nm to about 500 nm, from about 20 nm to about 400 nm, from about 20 nm to about 300 nm, from about 20 nm to about 200 nm, from about 20 nm to about 100 nm, from about 20 nm to about 50 nm, from about 20 nm to about 40 nm, from about 20 nm to about 30 nm, from about 30 nm to about 500 nm, from about 30 nm to about 400 nm, from about 30 nm to about 300 nm, from about 30 nm to about 200 nm, from about 30 nm to about 100 nm, from about 30 nm to about 50 nm, from about 30 nm to about 40 nm, from about 40 nm to about 500 nm, from about 40 nm to about 400 nm, from about 40 nm to about 300 nm, from about 40 nm to about 200 nm, from about 40 nm to about 100 nm, from about 40 nm to about 50 nm, from about 50 nm to about 500 nm, from about 50 nm to about 400 nm, from about 50 nm to about 300 nm, from about 50 nm to about 200 nm, from about 50 nm to about 100 nm, from about 100 nm to about 500 nm, from about 100 nm to about 400 nm, from about 100 nm to about 300 nm, from about 100 nm to about 200 nm, from about 200 m to about 500 nm, from about 200 nm to about 400 nm, from about 200 nm to about 300 nm, from about 300 nm to about 500 nm, from about 300 nm to about 400 nm, or from about 400 nm to about 500 nm, but may not be limited thereto.

In an embodiment of the present disclosure, the silicon-containing film may be formed on at least one substrate selected from typical silicon semiconductor wafers, compound semiconductor wafers and plastic substrates (PI, PET, PES, and PEN), but may not be limited thereto. Further, a substrate including holes or grooves may be used, or a porous substrate having a large surface area may be used, but may not be limited thereto. Also, the silicon-containing film may be simultaneously or sequentially formed on all or part of a substrate in which two or more different substrates are contacted or connected with each other, but may not be limited thereto.

In an embodiment of the present disclosure, the silicon-containing film may be formed on a substrate including trenches with an aspect ratio of about from 1 to about 50 and a width of from about 10 nm to about 1 μm, but may not be limited thereto. For example, the aspect ratio may be in the range of from about 1 to about 50, from about 1 to about 40, from about 1 to about 30, from about 1 to about 20, from about 1 to about 10, from about 10 to about 50, from about 10 to about 40, from about 10 to about 30, from about 10 to about 20, from about 20 to about 50, from about 20 to about 40, from about 20 to about 30, from about 30 to about 50, from about 30 to about 40, or from about 40 to about 50, but may not be limited thereto. Further, for example, the width may be in the range of from about 10 nm to about 1 μm, from about 10 nm to about 900 nm, from about 10 nm to about 800 nm, from about 10 nm to about 700 nm, from about 10 nm to about 600 nm, from about 10 nm to about 500 nm, from about 10 nm to about 400 nm, from about 10 nm to about 300 nm, from about 10 nm to about 200 nm, from about 10 nm to about 100 nm, from about 10 nm to about 90 nm, from about 10 nm to about 80 nm, from about 10 nm to about 70 nm, from about 10 nm to about 60 nm, from about 10 to about 50 nm, from about 10 nm to about 40 nm, from about 10 nm to about 30 nm, from about 10 nm to about 20 nm, from about 20 nm to about 1 μm, from about 20 nm to about 900 nm, from about 20 nm to about 800 nm, from about 20 nm to about 700 nm, from about 20 nm to about 600 nm, from about 20 nm to about 500 nm, from about 20 nm to about 400 nm, from about 20 nm to about 300 nm, from about 20 nm to about 200 nm, from about 20 nm to about 100 nm, from about 20 nm to about 90 nm, from about 20 nm to about 80 nm, from about 20 nm to about 70 nm, from about 20 nm to about 60 nm, from about 20 to about 50 nm, from about 20 nm to about 40 nm, from about 20 nm to about 30 nm, from about 30 nm to about 1 μm, from about 30 nm to about 900 nm, from about 30 nm to about 800 nm, from about 30 nm to about 700 nm, from about 30 nm to about 600 nm, from about 30 nm to about 500 nm, from about 30 nm to about 400 nm, from about 30 nm to about 300 nm, from about 30 nm to about 200 nm, from about 30 nm to about 100 nm, from about 30 nm to about 90 nm, from about 30 nm to about 80 nm, from about 30 nm to about 70 nm, from about 30 nm to about 60 nm, from about 30 to about 50 nm, from about 30 nm to about 40 nm, from about 40 nm to about 1 µm, from about 40 nm to about 900 nm, from about 40 nm to about 800 nm, from about 40 nm to about 700 nm, from about 40 nm to about 600 nm, from about 40 nm to about 500 nm, from about 40 nm to about 400 nm, from about 40 nm to about 300 nm, from about 40 nm to about 200 nm, from about 40 nm to about 100 nm, from about 40 nm to about 90 nm, from about 40 nm to about 80 nm, from about 40 nm to about 70 nm, from about 40 nm to about 60 nm, from about 40 to about 50 nm, from about 50 nm to about 1 µm, from about 50 nm to about 900 nm, from about 50 nm to about 800 nm, from about 50 nm to about 700 nm, from about 50 nm to about 600 nm, from about 50 nm to about 500 nm, from about 50 nm to about 400 nm, from about 50 nm to about 300 nm, from about 50 nm to about 200 nm, from about 50 nm to about 100 nm, from about 50 nm to about 90 nm, from about 50 nm to about 80 nm, from about 50 nm to about 70 nm, from about 50 nm to about 60 nm, from about 100 nm to about 1 µm, from about 100 nm to about 900 nm, from about 100 nm to about 800 nm, from about 100 nm to about 700 nm, from about 100 nm to about 600 nm, from about 100 nm to about 500 nm, from about 100 nm to about 400 nm, from about 100 nm to about 300 nm, from about 100 nm to about 200 nm, from about 200 nm to about 1 µm, from about 200 nm to about 900 nm, from about 200 nm to about 800 nm, from about 200 nm to about 700 nm, from about 200 nm to about 600 nm, from about 200 nm to about 500 nm, from about 200 nm to about 400 nm, from about 200 nm to about 300 nm, from about 300 nm to about 1 µm, from about 300 nm to about 900 nm, from about 300 nm to about 800 nm, from about 300 nm to about 700 nm, from about 300 nm to about 600 nm, from about 300 nm to about 500 nm, from about 300 nm to about 400 nm, from about 400 nm to about 1 µm, from about 400 nm to about 900 nm, from about 400 nm to about 800 nm, from about 400 nm to about 700 nm, from about 400 nm to about 600 nm, from about 400 nm to about 500 nm, from about 500 nm to about 1 µm, from about 500 nm to about 900 nm, from about 500 nm to about 800 nm, from about 500 nm to about 700 nm, from about 500 nm to about 600 nm, from about 600 nm to about 1 µm, from about 600 nm to about 900 nm, from about 600 nm to about 800 nm, from about 600 nm to about 700 nm, from about 700 nm to about 1 µm, from about 700 nm to about 900 nm, from about 700 nm to about 800 nm, from about 800 nm to about 1 µm, from about 800 nm to about 900 nm, or from about 900 nm to about 1 µm, but may not be limited thereto.

In an embodiment of the present disclosure, the method of forming a silicon-containing film includes forming a silicon-containing oxide film or thin film or nitride film or thin film on a substrate located inside a deposition chamber by supplying a precursor composition for forming a silicon-containing oxide thin film or nitride thin film in the form of a gas onto the substrate, but may not be limited thereto. The method of forming a film may be performed using a method and an apparatus known in the art, or may be performed using at least one additional reaction gas if necessary.

In the embodiments of the present disclosure, the silicon precursor compound of the present disclosure included in the precursor composition for forming a film can be used as a precursor for atomic layer deposition or chemical vapor deposition due to its high vapor pressure, low density, and high thermal stability, and, thus, a silicon-containing film can be formed. In particular, the silicon precursor compound is highly effective in uniformly forming a silicon-containing oxide or nitride thin film having a thickness of from several nm to several µm, or from about 1 nm to about 500 nm even on a substrate having a pattern (groove) on the surface, a porous substrate, or a plastic substrate in a wide temperature range of from about 100° C. to about 500° C.

In an embodiment of the present disclosure, in the method of forming a silicon-containing film, desirably, a substrate is accommodated inside a reaction chamber and the silicon precursor compound is transferred onto the substrate using a carrier gas or a dilution gas to form a silicon-containing oxide thin film or nitride thin film in a wide deposition temperature range of from about 100° C. to about 500° C. Here, being capable of forming the silicon-containing film in the wide deposition temperature range has great potential for application in various fields by widely expanding a range of process temperatures applicable to memory devices, logic devices, and display devices. Further, since each of a silicon-containing oxide film, a silicon-containing nitride film, or a silicon-containing carbide film has different film properties from each other, there is a need for a silicon precursor compound usable in a wide temperature range and deposition. Therefore, it is desirable that the film should be deposited in a wide deposition temperature range of from about 100° C. to about 500° C. However, the present disclosure may not be limited thereto.

In an embodiment of the present disclosure, in the method of forming a silicon-containing film, desirably, at least one gas mixture selected from argon (Ar), nitrogen ($N_2$), helium (He) and hydrogen ($H_2$) may be used as the carrier gas or the dilution gas. Also, the silicon precursor compound may be transferred onto the substrate by various supply methods including: a bubbling method of forcibly vaporizing the precursor using a carrier gas; a liquid delivery system (LDS) method of supplying the precursor in a liquid state at room temperature and vaporizing the precursor through a vaporizer; and a vapor flow controller (VFC) method of directly supplying the precursor using a vapor pressure of the precursor. Most desirably, if the vapor pressure of the silicon precursor compound is high, the VFC method may be used. The LDS method of supplying the precursor in a liquid state, vaporizing the precursor in a vaporizer and supplying it into the chamber, and the VFC method of heating a container and vaporizing the precursor if the vapor pressure is low may be used. Most desirably, the silicon precursor compound may be placed in a bubbler container, an LDS container or a VFC container and transferred and supplied into the chamber by means of a high vapor pressure by bubbling, LDS or VFC using a carrier gas in a pressure range of from about 0.1 torr to about 10 torr and a temperature range of from room temperature to about 100° C. However, the present disclosure may not be limited thereto.

In an embodiment of the present disclosure, an argon (Ar) or nitrogen ($N_2$) gas may be used as a carrier gas or heat energy or plasma may be used to vaporize the silicon precursor compound, and more desirably, a bias may be applied onto the substrate. However, the present disclosure may not be limited thereto.

Hereinafter, the present disclosure will be explained in more detail with reference to Examples. However, the following Examples are illustrative only for better understanding of the present disclosure but do not limit the present disclosure.

MODE FOR CARRYING OUT THE INVENTION

Examples

<Example 1> Preparation of Compound 3[$H_5Si_2N$($^iPr$)($SiMe_3$)]

In a 2-L round-bottom flask, 121 g (2.5 M, 0.446 mol) of n-butyllithium hexane solution (n-BuLi in n-hex.) was mixed with 1,000 mL of anhydrous hexane. After 58.6 g (0.446 mol) of (iso-propyl)(trimethylsilyl) amine [HN($^i$Pr)(SiMe$_3$)] was added into the resultant solution at about −20° C., the temperature was slowly increased to room temperature and then, the reaction mixture was stirred for 4 hours. After a solution in which 100 g (0.372 mol) of hexachlorodisilane was mixed with 500 mL of anhydrous hexane was added into the resultant lithium(isopropyl)(trimethylsilyl) amine salt solution at from −50° C. to −40° C. for about 30 minutes, the temperature was slowly increased with stirring and then, the reaction mixture was stirred for 17 hours. After completion of the reaction, the salt produced from the reaction was removed through a filtration process, and the solvent and volatile side reactant were removed through distillation under reduced pressure to obtain 114 g of a colorless liquid compound (iso-propyl)(trimethylsilyl) aminopentachlorodisilane [Cl$_5$Si$_2$(N($^i$Pr)(SiMe$_3$)] (yield: 84%).

Also, in another 1-L round-bottom flask, 25.94 g (0.626 mol) of lithium aluminum hydride (LiAlH$_4$), 350 mL of diethyl ether and 500 mL of anhydrous hexane were mixed, and the reaction mixture was cooled to −20° C. After a solution in which 114 g (0.313 mol) of (iso-propyl)(trimethylsilyl) aminopentachlorodisilane obtained in the above-described process was mixed with 200 mL of hexane was added into the resultant solution at from −20° C. to −10° C. for 10 minutes, the temperature was slowly increased to room temperature with stirring and then, the reaction mixture was stirred for 17 hours. The salt produced from the reaction was removed through a filtration process, and the solvent and volatile side reactant were removed through distillation under reduced pressure to obtain 50.7 g of a colorless liquid compound (iso-propyl) (trimethylsilyl) aminodisilane [H$_3$Si$_2$N($^i$Pr)(SiMe$_3$)] (yield: 85%).

b.p: 50° C. and 10 torr (167.4° C. and 760 mmHg)

$^1$H-NMR (C$_6$D$_6$): δ 0.109 (N—Si—CH$_3$, s, 9H), δ 1.076, 1.060 (N—CH—CH$_3$, d, 6H), δ 3.354 (Si—Si—H$_3$, t, 3H), δ 4.872 (Si—Si—H$_2$, q, 2H), δ 3.132 (N—CH—CH$_3$, m, 1H)

<Example 2> Preparation of Compound 4[H$_5$Si$_2$N($^{sec}$Bu)(SiMe$_3$)]

A solution in which 57.6 g (yield: 85%, (0.115 mol)) of (sec-butyl)(trimethylsilyl) aminopentachlorodisilane [Cl$_5$Si$_2$N($^{sec}$Bu)(SiMe$_3$)] prepared by the same method as in Example 1 was mixed with 100 mL of anhydrous hexane was used together with 9.2 g (0.242 mol) of lithium aluminum hydride (LiAlH$_4$), 250 mL of diethyl ether and 150 mL of anhydrous hexane to obtain 23 g of a colorless liquid compound (sec-butyl) (trimethylsilyl) aminodisilane [H$_5$Si$_2$N($^{sec}$Bu)(SiMe$_3$)] (yield: 75%) by the same method as in Example 1.

b.p: 80° C. and 10 torr (204.3° C. and 760 mmHg)

$^1$H-NMR (C$_6$D$_6$): δ 0.122 (N—Si—CH$_3$, s, 9H), δ 0.770 (N—CH—CH$_2$—CH$_3$, t, 3H), δ 1.077, 1.061 (N—CH—CH$_3$, d, 3H), δ 1.338 (N—CH—CH$_2$—CH$_3$, m, 1H), δ 11.494 (N—CH—CH$_2$—CH$_3$, m, 1H), δ 2.763 (N—CH—CH$_3$, m, 1H), δ 3.365 (Si—Si—H$_3$, t, 3H), δ 4.854 (Si—Si—H$_2$, q, 2H)

<Example 3> Preparation of Compound 9[$^i$Pr$_2$NSi$_2$H$_4$N(SiHMe$_2$)$_2$]

In a 5-L round-bottom flask, 328 g (0.987 mol) of (tetramethyldisilyl) aminopentachlorodisilane [Cl$_5$Si$_2$N(SiHMe$_2$)$_2$] prepared by the same method as in Example 5 was mixed with 3,000 mL of anhydrous hexane, and the resultant mixture was cooled to −30° C. by using dry ice. After a solution in which 272.23 g (2.690 mol) of diisopropylamine was mixed with 1,000 mL of anhydrous hexane was added into the reaction mixture at from −30° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 308.84 g of a colorless liquid compound 1-(di-iso-propyl)amino-2-(tetramethyldisilyl)aminotetrachlorodisilane [($^i$Pr)$_2$NSi$_2$Cl$_4$N(SiHMe$_2$)$_2$] (yield: 80%).

In a 3-L round-bottom flask, 39.673 g (1.045 mol) of lithium aluminum hydride (LiAlH$_4$), 1,000 mL of tetrahydrofuran and 500 mL of anhydrous hexane were mixed. After a solution in which 300 g (0.697 mol) of 1-(di-iso-propyl)amino-2-(tetramethyldisilyl)aminotetrachlorodisilane obtained in the above-described process was mixed with 500 mL of hexane was added into the resultant solution at from −20° C. to −10° C. for from 30 minutes to 60 minutes, the temperature was slowly increased to room temperature with stirring and then, the reaction mixture was heated to from 35° C. to 40° C. and reacted for 17 hours. The salt produced from the reaction was removed through a filtration process, and the solvent and volatile side reactant were removed through distillation under reduced pressure to obtain 173.3 g of a colorless liquid compound 1-di-iso-propylamino-2-(tetramethyldisilyl) amino disilane [($^i$Pr)$_2$NSi$_2$H$_4$N(SiHMe$_2$)$_2$] (yield: 85.4%).

b.p: 60° C. and 0.28 torr (252.4° C. and 760 mmHg)

$^1$H-NMR (C$_6$D$_6$): δ 0.258, 0.266 (N—Si—CH$_3$, d, 12H), δ 1.051, 1.068 (N—CH—CH$_3$, d, 12H, δ 2.993 (N—CH, m, 2H), δ 4.804 (N—Si—H, m, 2H), δ 4.937 (Si—Si—H$_2$, t, 2H), δ 4.947 (Si—Si—H$_2$, t, 2H)

<Example 4> Preparation of Compound 10[$^{sec}$Bu$_2$NSi$_2$H$_4$N(SiHMe$_2$)$_2$]

In a 3-L round-bottom flask, 100 g (0.273 mol) of (tetramethyldisilyl) aminopentachlorodisilane [Cl$_5$Si$_2$N(SiHMe$_2$)$_2$] prepared by the same method as in Example 5 was mixed with 1,500 mL of anhydrous hexane, and the resultant mixture was cooled to −30° C. by using dry ice. After a solution in which 106.01 g (0.820 mol) of di-sec-butylamine was mixed with 300 mL of anhydrous hexane was added into the reaction mixture at from −30° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 107.85 g of a colorless liquid compound di-sec-butylamino(tetramethyldisilyl) aminotetrachlorodisilane [($^{sec}$Bu)$_2$NSi$_2$Cl$_4$N(SiHMe$_2$)$_2$] (yield: 86%).

In a 3-L round-bottom flask, 14.28 g (0.376 mol) of lithium aluminum hydride (LiAlH$_4$), 600 mL of tetrahydrofuran and 400 mL of anhydrous hexane were mixed. After a solution in which 107.85 g (0.235 mol) of di-sec-butylamino (tetramethyldisilyl) aminotetrachlorodisilane obtained in the above-described process was mixed with 200 mL of hexane was added into the resultant solution at from −20° C. to −10° C. for from 20 minutes to 30 minutes, the temperature was slowly increased to room temperature with stirring and then, the reaction mixture was heated to from 35° C. to 40° C. and reacted for 17 hours. The salt produced from the reaction was removed through a filtration process, and the solvent and volatile side reactant were removed through distillation under reduced pressure to obtain 60.2 g of a colorless liquid compound di-sec-butylamino(tetramethyldisilyl) aminodisilane [($^{sec}$Bu)$_2$NSi$_2$H$_4$N(SiHMe2)2] (yield: 80%).

b.p: 82° C. and 0.3 torr (282° C. and 760 mmHg)

$^1$H-NMR(C$_6$D$_6$): δ 0.258, 0.266 (N—Si—C$\underline{H}_3$, d, 12H), δ 0.853 (N—CH—CH$_2$—C$\underline{H}_3$, t, 3H), δ 0.860 (N—CH—CH$_2$—C$\underline{H}_3$, t, 3H), δ 1.052, 1.069 (N—CH—C$\underline{H}_3$, d, 3H), δ 1.069, 1.086 (N—CH—C$\underline{H}_3$, d, 3H), δ 1.328 (N—CH—C$\underline{H}_2$, m, 2H), δ 1.485 (N—CH—C$\underline{H}_2$, m, 2H), δ 2.644 (N—C$\underline{H}$, m, 2H), δ 4.796 (N—Si—$\underline{H}$, m, 2H), δ 4.934 (Si—Si—$\underline{H}_2$, t, 2H), δ 4.944 (Si—Si—$\underline{H}_2$, t, 2H)

<Example 5> Preparation of Compound 11[(Me$_2$SiH)$_2$NSi$_2$H$_4$N(SiHMe$_2$)$_2$]

In a 3-L round-bottom flask, 100 g (0.372 mol) of hexachlorodisilane was mixed with 500 mL of anhydrous hexane, and the resultant mixture was cooled to −40° C. by using dry ice. After a solution in which 49.6 g (0.372 mol) of 1,1,3,3-tetramethyldisilazane and 41.40 g (0.409 mol) of triethylamine (TEA) were mixed with 300 mL of hexane was added into the reaction mixture at from −40° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 95.25 g of a colorless liquid compound (tetramethyldisilyl) aminopentachlorodisilane [Cl$_3$SiCl$_2$SiN(SiHC$_2$H$_6$)$_2$] (yield: 70%).

In a 3-L round-bottom flask, 79.77 g (2.5 M, 0.286 mol) of n-butyllithium hexane solution (n-BuLi in n-hex.) was mixed with 1,000 mL of anhydrous hexane. After 38.13 g (0.286 mol) of 1,1,3,3-tetramethyldisilazane was added into the resultant solution at about −20° C., the temperature was slowly increased to room temperature with stirring and then, the reaction mixture was stirred for 4 hours. After 95.25 g (0.260 mol) of (tetramethyldisilyl) aminopentachlorodisilane [Cl$_3$SiCl$_2$SiN(SiHC$_2$H$_6$)$_2$] obtained in the above-described process was added into the resultant lithium(tetramethylsilyl) amine salt solution at from −40° C. to −30° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 85.28 g of a colorless liquid compound 1,2-bis-(tetramethyldisilyl) aminotetrachlorodisilane [(SiHMe$_2$)$_2$NSi$_2$Cl$_4$N(SiHMe$_2$)$_2$] (yield: 71%).

In a 1-L round-bottom flask, 11.19 g (0.295 mol) of lithium aluminum hydride (LiAlH$_4$), 300 mL of tetrahydrofuran and 250 mL of anhydrous hexane were mixed. After a solution in which 85.28 g (0.184 mol) of 1,2-bis-(tetramethyldisilyl) aminotetrachlorodisilane [(SiHMe$_2$)$_2$NSi$_2$Cl$_4$N(SiHMe$_2$)$_2$] obtained in the above-described process was mixed with 100 mL of hexane was added into the resultant solution at from −20° C. to −10° C. for from 10 minutes to 20 minutes, the temperature was slowly increased to room temperature with stirring and then, the reaction mixture was heated to from 40° C. to 50° C. and reacted for 4 hours and then, reacted at room temperature for 12 hours. The salt produced from the reaction was removed through a filtration process, and the solvent and volatile side reactant were removed through distillation under reduced pressure to obtain 42 g of a colorless liquid compound 1,2-bis-(tetramethyldisilyl) aminodisilane [(SiHMe$_2$)$_2$NSi$_2$H$_4$N(SiHMe$_2$)$_2$] (yield: 70%).

b.p: 65° C. and 0.38 torr (254.1° C. and 760 mmHg)

$^1$H-NMR (C$_6$D$_6$): δ 0.235, 0.244 (N—Si—C$\underline{H}_3$, d, 12H), δ 4.791 (N—Si—$\underline{H}$, m, 2H), δ 4.947 (Si—Si—$\underline{H}_2$, s, 4H)

<Example 6> Preparation of Compound 13[$^i$Pr$_2$NSi$_2$H$_4$N($^i$Pr)(SiMe$_3$)]

In a 1-L round-bottom flask, 44.7 g (2.5 M, 0.165 mol) of n-butyllithium hexane solution (n-BuLi in n-hex.) was mixed with 500 mL of anhydrous hexane. After 16.7 g (0.165 mol) of diisopropylamine was added into the resultant solution at about −20° C., the temperature was slowly increased to room temperature with stirring and then, the reaction mixture was stirred for 4 hours. After 50 g (0.137 mol) of (iso-propyl)(trimethylsilyl) aminopentachlorodisilane [Cl$_3$Si$_2$(N($^i$Pr)(SiMe$_3$)] prepared by the same method as in Example 4 was added into the resultant lithium(di-iso-propyl) amine salt solution at from −40° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 52 g of a colorless liquid compound 1-(di-iso-propylamino)-2-(iso-propyl)(trimethylsilyl) aminotetrachlorodisilane [($^i$Pr)$_2$NSi$_2$Cl$_4$N($^i$Pr)(SiMe$_3$)] (yield: 88%).

In a 1-L round-bottom flask, 6.91 g (0.182 mol) of lithium aluminum hydride (LiAlH$_4$), 250 mL of tetrahydrofuran and 150 mL of anhydrous hexane were mixed. After a solution in which 52 g (0.121 mol) of 1-(di-iso-propylamino)-2-(iso-propyl)(trimethylsilyl) aminotetrachlorodisilane [($^i$Pr)$_2$NSi$_2$Cl$_4$N($^i$Pr)(SiMe$_3$)] obtained in the above-described process was mixed with 100 mL of hexane was added into the resultant solution at from −20° C. to −10° C. for from 10 minutes to 20 minutes, the temperature was slowly increased to room temperature with stirring and then, the reaction mixture was heated to from 40° C. to 50° C. and reacted for 4 hours and then, reacted at room temperature for 12 hours. The salt produced from the reaction was removed through a filtration process, and the solvent and volatile side reactant were removed through distillation under reduced pressure to obtain 21 g of a colorless liquid compound (iso-propyl)(trimethylsilyl) amino(di-iso-propylamino) disilane [($^i$Pr)$_2$NSi$_2$H$_4$N($^i$Pr)(SiMe$_3$)] (yield: 64%).

b.p: 58° C. and 0.4 torr (242.9° C. and 760 mmHg)

$^1$H-NMR(C$_6$D$_6$): δ 0.193 (N—Si—C$\underline{H}_3$, s, 9H), δ 1.087, 1.070 (N—CH—C$\underline{H}_3$, d, 12H), δ 1.171, 1.155 (N—CH—C$\underline{H}_3$, d, 6H), δ 3.018 (N—C$\underline{H}$—CH$_3$, m, 2H), δ 3.181 (N—C$\underline{H}$—CH$_3$, m, 1H), δ 4.871 (Si—Si—$\underline{H}_2$, t, 2H), δ 4.882 (Si—Si—$\underline{H}_2$, t, 2H)

<Example 7> Preparation of Compound 14[$^{sec}$Bu$_2$NSi$_2$H$_4$N($^i$Pr)(SiMe$_3$)]

In a 1-L round-bottom flask, after 50 g (0.137 mol) of (iso-propyl)(trimethylsilyl) aminopentachlorodisilane [Cl$_5$Si$_2$(N($^i$Pr)(SiMe$_3$)] prepared by the same method as in Example 4 was added to a solution in which 26.65 g (0.206 mol) of di-sec-butylamine ((s-Bu)$_2$NH) and 20.87 g (0.206 mol) of triethylamine (TEA) were mixed with 500 mL of hexane at from −30° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 40.9 g of a colorless liquid compound 1-(di-sec-butyl)amino-2-(iso-propyl)(trimethylsilyl) aminotetrachlorodisilane [($^{sec}$Bu)$_2$NSi$_2$Cl$_4$N($^i$Pr)(SiMe$_3$)] (yield: 65%).

In a 1-L round-bottom flask, 5.1 g (0.134 mol) of lithium aluminum hydride (LiAlH$_4$), 250 mL of tetrahydrofuran and 150 mL of anhydrous hexane were mixed. After a solution in which 40.9 g (0.0809 mol) of 1-(di-sec-butyl)amino-2-(iso-propyl)(trimethylsilyl) aminotetrachlorodisilane obtained in the above-described process was mixed with 100 mL of hexane was added into the resultant solution at from −20° C. to −10° C. for from 10 minutes to 20 minutes, the temperature was slowly increased to room temperature with stirring and then, the reaction mixture was heated to from 40° C. to 50° C. and reacted for 4 hours and then, reacted at room temperature for 12 hours. The salt produced from the reaction was removed through a filtration process, and the solvent and volatile side reactant were removed through distillation under reduced pressure to obtain 22 g of a colorless liquid compound 1-(di-sec-butyl)amino-2-(isopropyl)(trimethylsilyl) aminodisilane [($^{sec}$Bu)$_2$NSi$_2$H$_4$N(iPr)(SiMe$_3$)] (yield: 77%).

b.p: 63° C. and 0.3 torr (255.8° C. and 760 mmHg)

$^1$H-NMR (C$_6$D$_6$): δ 0.200 (N—Si—CH$_3$, s, 9H), δ 0.882 (N—CH—CH$_2$—CH$_3$, t, 6H), δ 1.072, 1.090 ($^s$N—CH—CH$_3$, d, 6H), δ 1.159, 1.175 (N—CH—CH$_3$, d, 6H), δ 1.329 (N—CH—CH$_2$—CH$_3$, m, 2H), δ 1.508 (N—CH—CH$_2$—CH$_3$, m, 2H), δ 2.663 ($^s$N—CH—CH$_3$, m, 2H), δ 3.164 (N—CH—CH$_3$, q, 61H), δ 4.887 (Si—Si—H$_2$, t, 2H), δ 4.899 (Si—Si—H$_2$, t, 2H)

<Example 8> Preparation of Compound 27[H$_3$SiN($^i$Pr)(SiMe$_3$)]

In a 2-L round-bottom flask, 303.3 g (2.5 M, 1.089 mol) of n-butyllithium hexane solution (n-BuLi in n-hex.) was mixed with 500 mL of anhydrous hexane. After 43 g (1.089 mol) of (iso-propyl)(trimethylsilyl) amine [($^i$Pr)(SiMe$_3$)NH] was added into the resultant solution at about −20° C., the temperature was slowly increased to room temperature with stirring and then, the reaction mixture was stirred for 4 hours. After 122 g (0.908 mol) of trichlorosilane (SiCl$_3$H) was added into the resultant solution at from −40° C. to −20° C., the temperature was slowly increased to room temperature with stirring and then, the reaction mixture was stirred for 17 hours. After completion of the reaction, the salt produced from the reaction was removed through a filtration process, and the solvent and volatile side reactant were removed through distillation under reduced pressure to obtain 142 g of a colorless liquid compound (iso-propyl)(trimethylsilyl) aminodichlorosilane [Cl$_2$SiHN($^i$Pr)(SiMe$_3$)] (yield: 68%).

Also, in another 1-L round-bottom flask, 4.9 g (0.130 mol) of lithium aluminum hydride (LiAlH$_4$), 300 mL of tetrahydrofuran and 300 mL of anhydrous hexane were mixed. After 50 g (0.217 mol) of (iso-propyl)(trimethylsilyl) aminodichlorosilane [Cl$_2$SiHN($^i$Pr)(SiMe$_3$)] obtained in the above-described process was slowly added into the solution mixture at room temperature while taking care of heat generation, the reaction mixture was heated to from 40° C. to 50° C. and stirred for 17 hours. The salt produced from the reaction was removed through a filtration process, and the solvent and volatile side reactant were removed through distillation under reduced pressure to obtain 21 g of a colorless liquid compound (iso-propyl)(trimethylsilyl) aminosilane [H$_3$SiN($^i$Pr)(SiMe$_3$)] (yield: 60%).

b.p: 25° C. and 10 torr (136.6° C. and 760 mmHg)

$^1$H-NMR(C$_6$D$_6$): δ 0.105 (N—Si—CH$_3$, s, 9H), δ 1.083 1.100 (N—CH—CH$_3$, d, 6H), δ 3.097 (N—CH, m, 1H), δ 4.517 (Si—H, s, 3H)

<Example 9> Preparation of Compound 28[H$_3$SiN($^{sec}$Bu)(SiMe$_3$)]

50 g (0.369 mol) of trichlorosilane (SiCl$_3$H) was added into and reacted with a solution in which 108.6 g (2.5 M, 0.406 mol) of n-butyllithium hexane solution (n-BuLi in n-hex.) was reacted with 64.36 g (0.443 mol) of (sec-butyl)(trimethylsilyl) amine [($^{sec}$Bu)(SiMe$_3$)NH] by the same method as in Example 8. After completion of the reaction, the salt produced from the reaction was removed through a filtration process, and the solvent and volatile side reactant were removed through distillation under reduced pressure to obtain 43 g of a colorless liquid compound (sec-butyl)(trimethylsilyl) aminodichlorosilane [Cl$_2$SiHN($^{sec}$Bu)(SiMe$_3$)] (yield: 47.7%).

4.02 g (0.105 mol) of lithium aluminum hydride (LiAlH$_4$) was reacted with 43 g (0.176 mol) of (sec-butyl)(trimethylsilyl) aminodichlorosilane [Cl$_2$SiHN($^{sec}$Bu)(SiMe$_3$)] obtained in the above-described process by the same method as in Example 8. The salt produced from the reaction was removed through a filtration process, and the solvent and volatile side reactant were removed through distillation under reduced pressure to obtain 18 g of a colorless liquid compound (sec-butyl)(trimethylsilyl) aminosilane [H$_3$SiN($^{sec}$Bu)(SiMe$_3$)] (yield: 58%).

b.p: 34° C. and 10 torr (147.7° C. and 760 mmHg)

$^1$H-NMR(C$_6$D$_6$): δ 0.115 (N—Si—CH$_3$, s, 9H), δ 0.795 (N—CH—CH$_2$—CH$_3$, t, 3H), δ 1.068 1.084 (N—CH—CH$_3$, d, 3H), δ 1.340 (N—CH—CH$_2$, m, 1H), δ 1.507 (N—CH—CH$_2$, m, 1H), δ 2.762 (N—CH, m, 1H), δ 4.490 (Si—H, s, 3H)

<Test Example 1> Structural Analysis of Silicon Precursor Compounds

Figure 2:
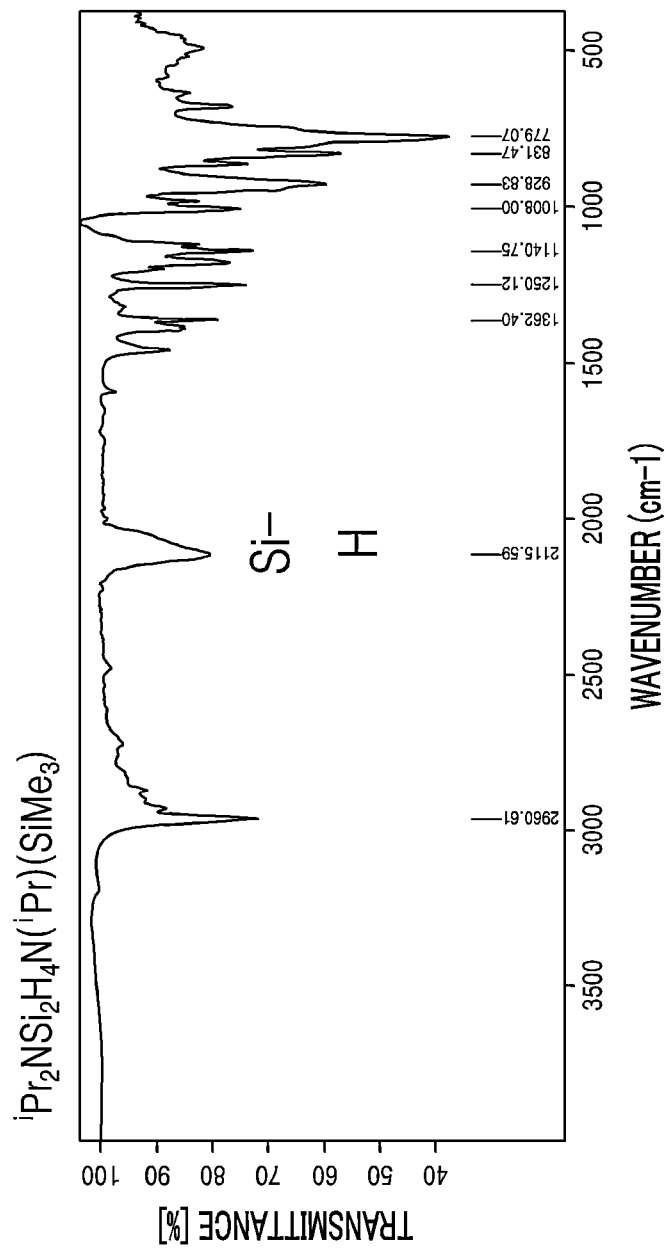
FIG. 2 shows an FT-IR spectrum of the silicon-containing compound prepared according to Example 6 of the present disclosure.

A $^1$H-NMR analysis was conducted to analyze the structures of the silicon precursor compounds prepared according to Examples 1, 3, 6 and 8, respectively (FIG. 1), an FT-IR analysis was further conducted on Example 6 (compound 13) (FIG. 2).

As shown in FIG. 1, the silicon precursor compound (compound 13) prepared according to Example 6 was confirmed to show Si—H peaks at 4.8 ppm and 4.92 ppm as a result of $^1$H-NMR analysis. Also, as shown in FIG. 2, the silicon precursor compound (compound 13) prepared according to Example 6 was confirmed to show a strong peak of Si—H in the molecule at 2155 cm$^{-1}$ as a result of FT-IR analysis. Compound 13 was confirmed from the results of $^1$H-NMR and FT-IR analyses, and it was confirmed from the structure of the material that compound 13 is an excellent precursor capable of forming a silicon-containing oxide and nitride thin films at various temperature ranges.

Figure 3:
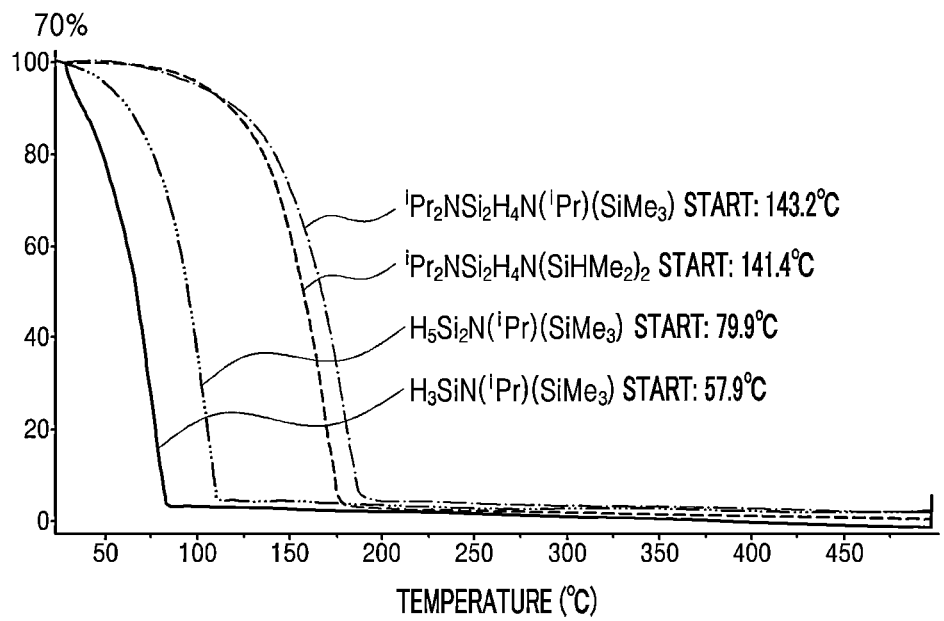
FIG. 3 shows TGA graphs of the silicone-containing compounds prepared according to Examples 1, 3, 6 and 8 of the present disclosure.

<Test Example 2> Analysis of Thermal Characteristics of Silicon Precursor Compounds A TG analysis was conducted to analyze the fundamental thermal characteristics of the silicon precursor compounds prepared according to Examples 1, 3, 6 and 8, respectively, and the results are shown in FIG. 3.

As can be seen from FIG. 3, all the silicon precursor compounds prepared according to Examples 1, 3, 6 and 8, respectively, were confirmed to show sufficient volatility to be applied to atomic layer deposition. Further, the silicon precursor compounds of the present disclosure exhibited various volatilities, and, thus, it was confirmed that they are excellent precursors capable of forming silicon-containing oxide and nitride thin films in a wide temperature range of from about 100° C. to about 500° C.

<Example 10> Low Temperature Deposition of Silicon Precursor Compounds

Atomic deposition using plasma (PEALD-Plasma Enhanced Atomic Layer Deposition) was performed with the silicon precursor compounds prepared by the methods of Examples 1, 3, 6, and 8, respectively. $O_2$ plasma was used as a reaction gas by applying a RF power of 200 W to an oxygen source $O_2$. First, a silicon wafer was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer was immersed in a dilute HF aqueous solution for 2 minutes to form a pure silicon surface. Thereafter, a silicon oxide thin film was prepared by plasma enhanced atomic layer deposition (PEALD). In order to measure deposition characteristics depending on the temperature, the number of ALD cycles was fixed to 100 and the substrate was heated at 50° C. intervals from 150° C. to 300° C. which are relatively low temperatures. The silicon precursor compounds were placed in respective containers made of stainless steel and then vaporized using an argon (Ar) gas having a flow rate of 200 sccm as a carrier gas for precursor compound while heating the containers at temperatures of 30° C., 60° C. and 60° C., respectively, and a process pressure of 1 torr in the reactor. The ALD cycle was composed of supply of each vaporized precursor for 3 sec, precursor purge for 10 sec, $O_2$ plasma exposure for 10 sec and $O_2$ plasma purge for 10 sec. The deposition results are shown in FIG. 4.

Figure 4:
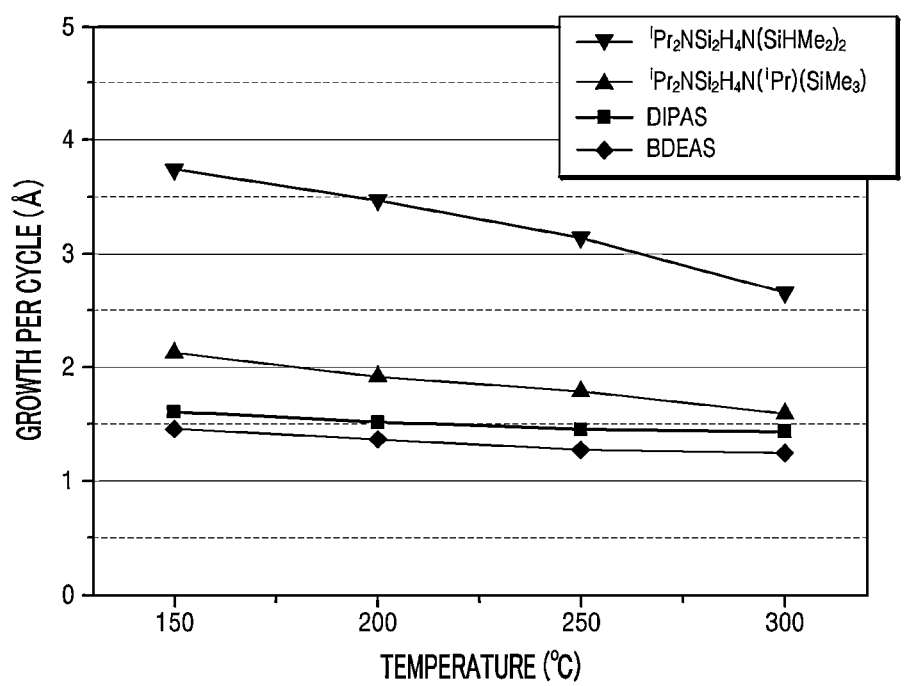
FIG. 4 is a graph showing the temperature-dependent growth rates of silicon-containing oxide thin films grown in the range of from 150° C. to 300° C. by atomic layer deposition of the silicon compounds prepared according to Examples 3 and 6 of the present disclosure.

As can be seen from FIG. 4, the silicon precursor compounds (compounds 9 and 13) prepared by the methods of Examples 3 and 6, respectively, showed higher growth rates than diisopropylaminosilane (DIPAS, $H_3SiN^iPr_2$) or bisdiethylaminosilane (BDEAS, $H_2Si(NEt_2)_2$) conventionally known in the art. Compounds 9 and 13 of Examples 3 and 6 including both silylamine and alkylamine had higher growth rates than DIPAS and BDEAS conventionally known in the art, and, thus, it was confirmed that the inclusion of both alkylamine and silylamine is helpful to have a high growth rate. Further, compound 9 of Example 3 having two Si atoms in a silylamine ligand was found to have a higher growth rate than compound 13 of Example 6 having one Si atom in a silylamine ligand, and, thus, it was confirmed that a silicon compound containing silylamine as a ligand having more Si atoms is helpful to have a high growth rate. Furthermore, silicon compound 9 prepared according to Example 3 was found to have a high growth rate, and, thus, it was confirmed that a disilane-based precursor is more helpful to have a high growth rate than a monosilane-based precursor when containing a silylamine ligand having the same number of Si atoms. It was confirmed that the disilane-based silicon compounds as described above exhibited significantly higher growth rates than DIPAS or BDEAS conventionally known in the art. In particular, the growth rate of precursor compound 9 of Example 3 was more than twice. Moreover, it was confirmed that a compound showing a high growth rate at a low temperature of 150° C. to 300° C. is an excellent precursor which can be widely applied to other fields, particularly displays, in addition to semiconductors.

<Example 11> Deposition Depending on Temperature of Silicon Precursor Compounds

Atomic deposition using plasma (PEALD-Plasma Enhanced Atomic Layer Deposition) was performed with the silicon precursor compounds prepared by the methods of Examples 3, 6, and 8, respectively. First, a silicon wafer was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer was immersed in a dilute HF aqueous solution for 2 minutes to form a pure silicon surface. Thereafter, a silicon oxide thin film was prepared by plasma enhanced atomic layer deposition (PEALD). In order to measure deposition characteristics depending on the temperature, the number of ALD cycles was fixed to 100 and the growth rates depending on the temperature at 50° C. intervals from 150° C. to 500° C. are shown in FIG. 5.

Figure 5:
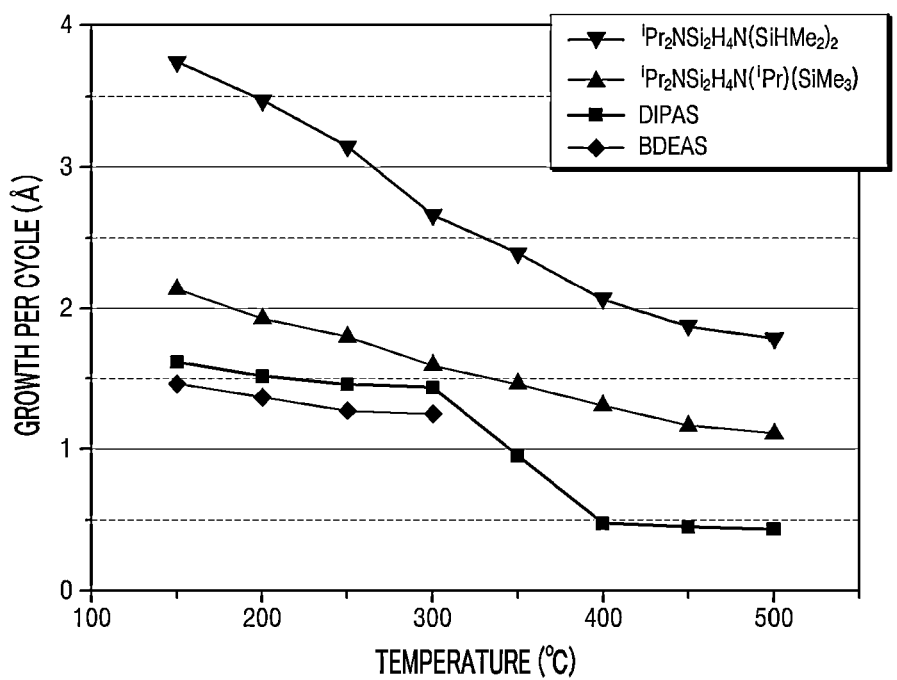
FIG. 5 is a graph showing the temperature-dependent growth rates of silicon-containing oxide thin films grown in the range of from 150° C. to 500° C. by atomic layer deposition of the silicon compounds prepared according to Examples 3 and 6 of the present disclosure.

As can be seen from FIG. 5, compound 13, which is a disilane precursor prepared according to Example 6, showed a significantly higher growth rate than DIPAS conventionally known in the art. In particular, compound 9 of Example 3 was confirmed to show a high growth rate of 3.79 Å/cy at 150° C. and 1.79 Å/cy at 500° C. It is determined that compound 9 as a single precursor can form a silicon-containing oxide thin film even in a temperature range of from about 100° C. to about 500° C., and it was confirmed that compound 9 is an excellent precursor which can be used in various fields, such as displays, in addition to semiconductors.

<Example 12> Deposition of Silicon Precursor Compounds Depending on Type of Reaction Gas Atomic deposition using plasma (PEALD-Plasma Enhanced Atomic Layer Deposition) was performed with the silicon precursor compounds prepared by the methods of Examples 3, 6, and 8, respectively. $N_2$ or $NH_3$ plasma was used as a reaction gas by applying a RF power of 500 W to a nitrogen source $N_2$ or $NH_3$. First, a silicon wafer was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer was immersed in a dilute HF aqueous solution for 2 minutes to form a pure silicon surface. Thereafter, a silicon nitride thin film was prepared by atomic layer deposition (ALD). In order to measure characteristics of the silicon nitride thin film depending on the precursor, the number of ALD cycles was fixed to 300 and the substrate was heated to 300° C. The precursors were placed in respective containers made of stainless steel and then vaporized using an argon (Ar) gas having a flow rate of 200 sccm as a carrier gas for precursor compound while heating the containers at temperatures of 30° C., 60° C. and 60° C., respectively, and a process pressure of 1 torr. The ALD cycle was composed of supply of each vaporized precursor for 3 sec, precursor purge for 5 sec, $N_2$ or $NH_3$ plasma exposure for 12 sec and $N_2$ or $NH_3$ plasma purge for 5 sec. Comparative tests were conducted by exposure to $N_2$ plasma or $NH_3$ plasma, respectively, and the results are shown in FIG. 6.

Figure 6:
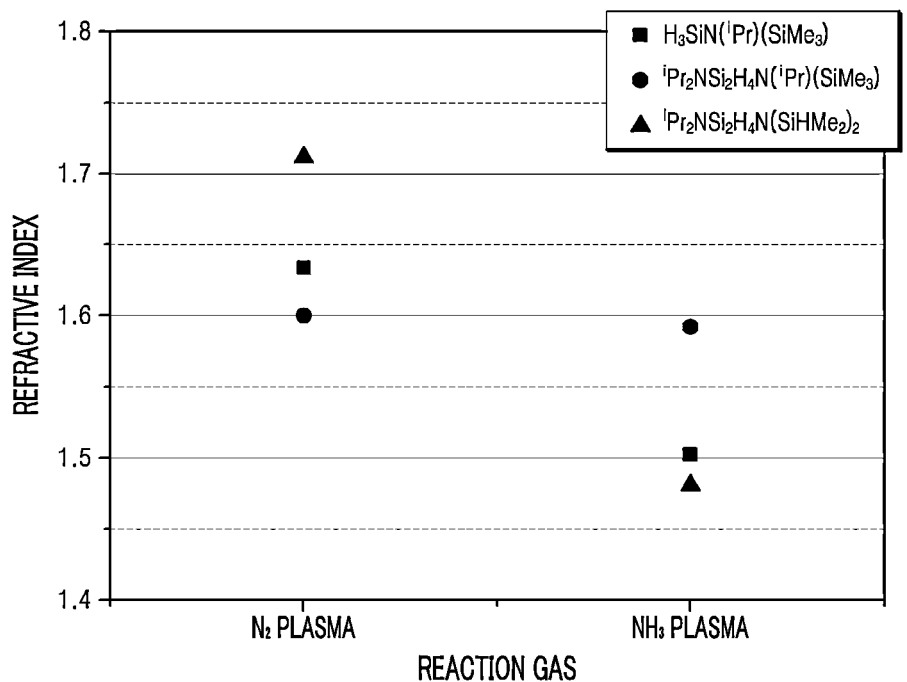
FIG. 6 is a graph showing the refractive indexes of silicon-containing nitride thin films grown at a low temperature of 300° C. with reaction gases of $NH_3$ and $N_2$ plasma by atomic layer deposition of the silicon compounds prepared according to Examples 3, 6 and 8 of the present disclosure.

As can be seen from FIG. 6, the silicon nitride thin film had different refractive index values at 300° C. depending on the nitrogen source used. As for all the three silicon precursor compounds, a thin film using $N_2$ plasma as a nitrogen source had a refractive index of 1.6 or more (1.6334, 1.6000, and 1.7116), whereas a thin film using $NH_3$ plasma as a nitrogen source had a refractive index of 1.6 or less (1.5020, 1.5920, and 1.4808). From the above-described tests, it was confirmed that a refractive index value varies depending on the presence or absence of H in the film, and it was confirmed that the refractive index varies depending on the amount of H originating from $NH_3$ or present in the precursor. As the conditions for forming an excellent silicon-containing nitride thin film, using $N_2$ plasma without H is better than using $NH_3$ plasma.

<Example 13> Deposition of Silicon Nitride Thin Film Deposition Depending on Temperature of Silicon Precursor Compound Atomic deposition using plasma (PEALD-Plasma Enhanced Atomic Layer Deposition) was performed with silicon precursor compound 3 prepared according to Example 1. $N_2$ plasma was used as a reaction gas by applying a RF power of 500 W to a nitrogen source $N_2$. First, a silicon wafer was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer was immersed in a dilute HF aqueous solution for 2 minutes to form a pure silicon surface. Thereafter, a silicon nitride thin film was prepared by atomic layer deposition (ALD). In order to measure characteristics of the silicon nitride thin film depending on the precursor, the number of ALD cycles was fixed to 300 and the substrate was heated at 50° C. intervals from 250° C. to 350° C. The precursor was placed in a container made of stainless steel and then vaporized using an argon (Ar) gas having a flow rate of 200 sccm as a carrier gas for precursor compound at room temperature and a process pressure of 1 torr. The ALD cycle was composed of supply of each vaporized precursor for 3 sec, precursor purge for 5 sec, $N_2$ plasma exposure for 12 sec and $N_2$ plasma purge for 5 sec. The silicon nitride thin film was deposited by exposure to $N_2$ plasma, and the results of growth rate (growth per cycle) and refractive index are shown in FIG. 7.

Figure 7:
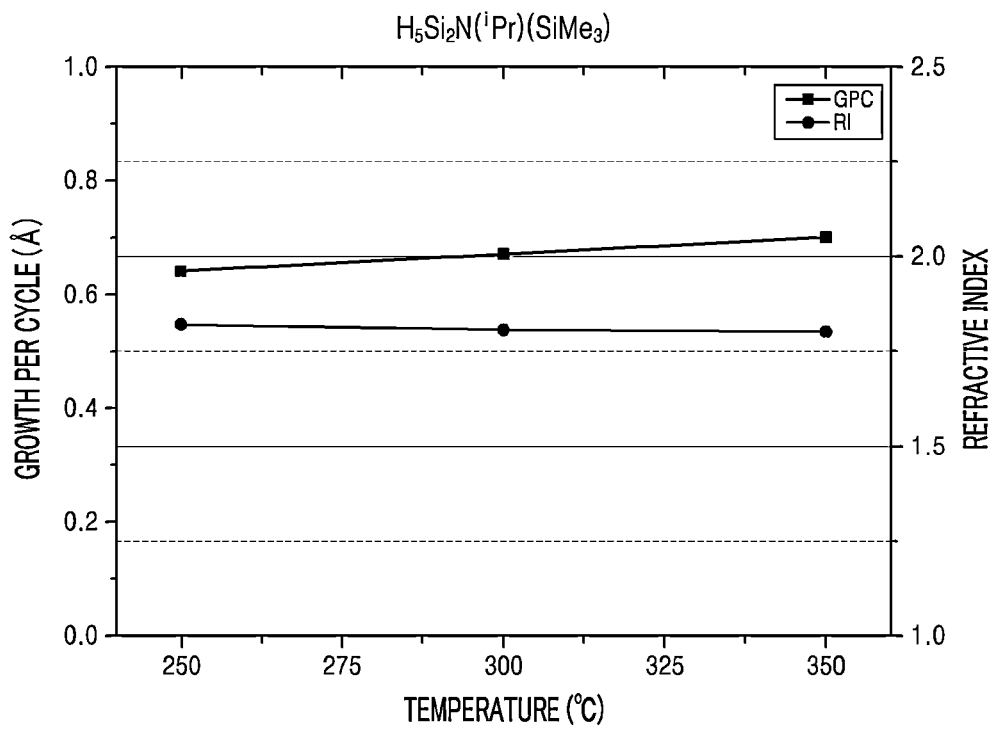
FIG. 7 is a graph showing the temperature-dependent growth per cycle (GPC) and refractive index of a silicon-containing nitride thin film grown at a temperature ranging from 250° C. to 300° C. with a reaction gas of $N_2$ plasma by atomic layer deposition of the silicon compound prepared according to Example 1 of the present disclosure.

As can be seen from FIG. 7, it was confirmed that the growth rate of the silicon nitride thin film increases as the temperature increases. The refractive index values were higher than 1.8, i.e., 1.8201, 1.8062, and 1.8020 at the respective temperatures. It was confirmed from the refractive index of 1.8 or more that compound 3 is an excellent precursor which can be used in various fields, such as displays, in addition to semiconductors.

<Example 14> Comparison of Growth Rate and Uniformity Between Silicon Precursor Compounds Atomic deposition using plasma (PEALD-Plasma Enhanced Atomic Layer Deposition) was performed with silicon precursor compound 9 prepared according to Example 3. $O_2$ plasma was used as a reaction gas by applying a RF power of 500 W to an oxygen source $O_2$. First, a silicon wafer was immersed for 10 minutes in a piranha solution in which sulfuric acid ($H_2SO_4$) and hydrogen peroxide ($H_2O_2$) were mixed at a ratio of 4:1 ratio and then taken out. Then, the silicon wafer was immersed in a dilute HF aqueous solution for 2 minutes to form a pure silicon surface. Thereafter, a silicon oxide thin film was prepared by plasma enhanced atomic layer deposition (PEALD). In order to measure characteristics of the silicon oxide thin film depending on the precursor, the number of ALD cycles was fixed to 400 and the substrate was heated to 125° C. Silicon precursor compound 9 was placed in a container made of stainless steel and then vaporized using an argon (Ar) gas having a flow rate of 500 sccm as a carrier gas for precursor compound while heating the container at a temperature of 60° C. and a process pressure of 1 torr in the reactor. The ALD cycle was composed of supply of each vaporized precursor for 1 sec, precursor purge for 1 sec, $O_2$ plasma exposure for 2 sec and $O_2$ plasma purge for 1 sec. The deposition results are shown in FIG. 8.

Figure 8:
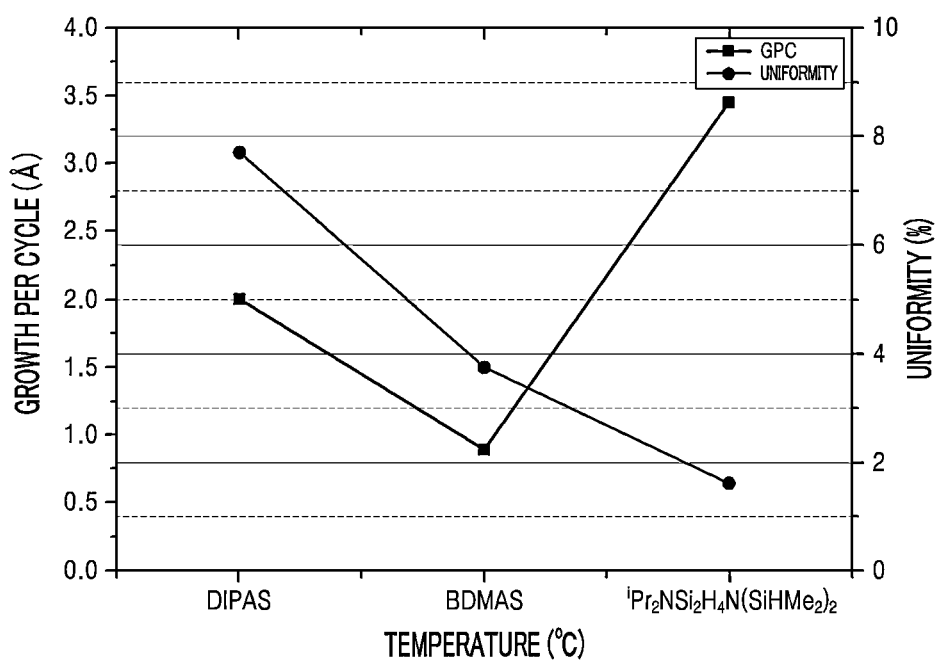
FIG. 8 is a graph showing the growth rate and uniformity of a silicon-containing oxide thin film grown at a low temperature of 125° C. by atomic layer deposition of the silicon compound prepared according to Example 3 of the present disclosure.
Figure 9A:
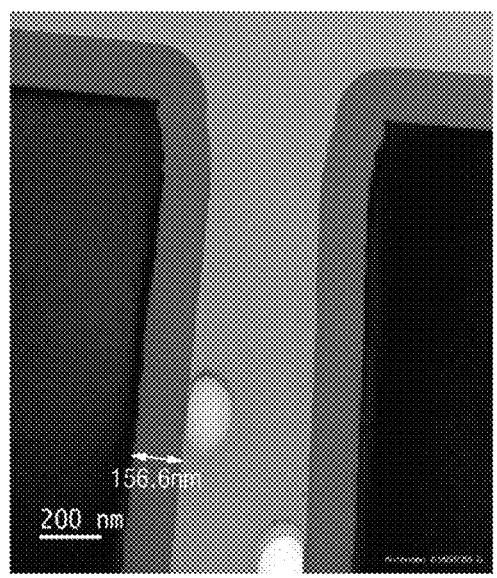
FIG. 9A and FIG. 9B are graphs showing the step coverage of a silicon-containing oxide thin film grown on a pattern substrate at a low temperature of 125° C. by atomic layer deposition of the silicon compound prepared according to Example 3 of the present disclosure.
Figure 9B:
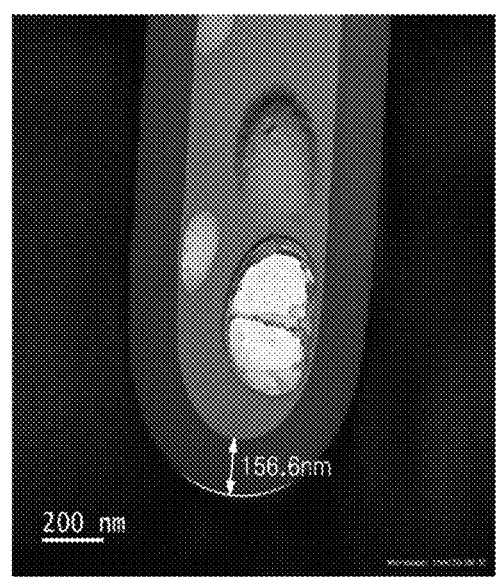
Figure 10A:
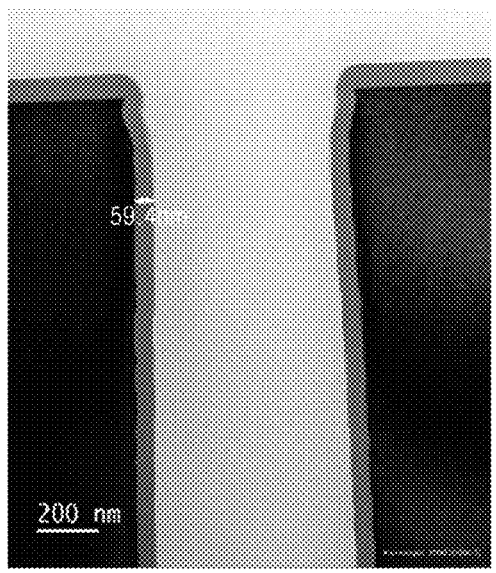
FIG. 10A and FIG. 10B are graphs showing the step coverage of a silicon-containing oxide thin film grown on a pattern substrate at a high temperature of 400° C. by atomic layer deposition of the silicon compound prepared according to Example 3 of the present disclosure.
Figure 10B:
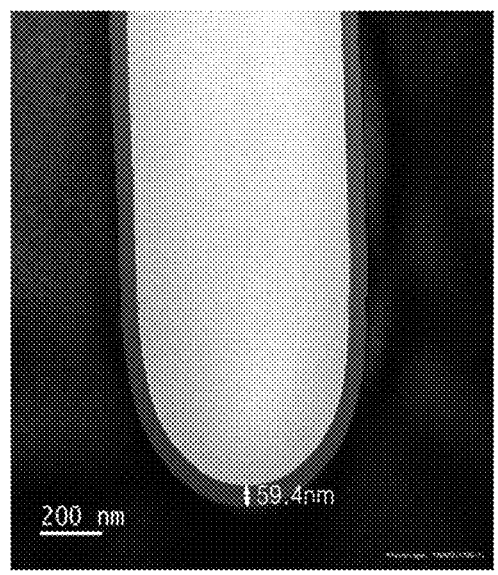

As can be seen from FIG. 8, it can be seen that the growth rate of silicon precursor compound 9 prepared according to Example 3 is significantly higher than that of DIPAS or BDMAS conventionally known in the art. Also, a silicon oxide film of precursor compound 9 of Example 3 deposited on a 6-inch substrate showed a remarkably low uniformity, which confirmed that it was most uniformly deposited. Accordingly, it was confirmed that compound 9 is an excellent precursor which can be used in various fields, such as displays, in addition to semiconductors.

<Example 15> S/C Characteristics of Silicon Precursor Compounds on Pattern Substrate Atomic deposition using plasma (PEALD-Plasma Enhanced Atomic Layer Deposition) was performed with silicon precursor compound 9 prepared according to Example 3. $O_2$ plasma was used as a reaction gas by applying a RF power of 500 W to an oxygen source $O_2$. In order to measure deposition characteristics of a substrate with narrow grooves depending on the temperature, the number of ALD cycles was fixed to 400 and the substrate was heated to 125° C. and 400° C. The silicon precursor compound was placed in a container made of stainless steel and then vaporized using an argon (Ar) gas having a flow rate of 200 sccm as a carrier gas for precursor compound while heating the container at a temperature of 60° C. and a process pressure of 1 torr in the reactor. The ALD cycle was composed of supply of each vaporized precursor for 1 sec, precursor purge for 1 sec, $O_2$ plasma exposure for 2 sec and $O_2$ plasma purge for 1 sec. The deposition results are shown in FIG. 9A, FIG. 9B, FIG. 10A and FIG. 10B.

The substrates shown in FIG. 9A, FIG. 9B, FIG. 10A and FIG. 10B have micro grooves having an aspect ratio of 10:1, and FIG. 9A, FIG. 9B, FIG. 10A and FIG. 10B show transmission electron microscopy (TEM) images of the cross sections of the films. It was confirmed from FIG. 9A, FIG. 9B, FIG. 10A and FIG. 10B that the growth rate of silicon precursor compound 9 prepared according to Example 3 as measured in FIG. 4 and FIG. 5 was relatively uniformly maintained even in the substrate with micro grooves. It was confirmed that compound 9 has a step coverage of 100% at which a top side surface of a groove and the deepest bottom portion of the groove have the same growth rate even in conditions in which a relatively high RF power of 500 W is applied at temperatures of 125° C. and 400° C. and the ALD cycle is less than 5 seconds. Accordingly, it was confirmed that compound 9 is an excellent precursor which can be used in the semiconductor market, where miniaturization is rapidly progressing, in various fields, such as displays, in addition to semiconductors.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A silicon precursor compound, represented by the following Chemical Formula 1 or the following Chemical Formula 2:

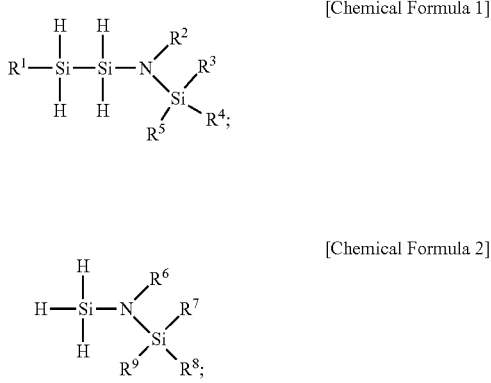

[Chemical Formula 1]

[Chemical Formula 2]

wherein, in the above Chemical Formula 1 and Chemical Formula 2, $R^1$ is hydrogen or $-NR^aR^b$, each of $R^a$ and $R^b$ is independently hydrogen, a linear or branched $C_1$-$C_5$ alkyl group, or dimethylsilyl group, or $R^a$ and $R^b$ are a substituted or unsubstituted $C_4$-$C_{10}$ cyclic alkyl group linked to each other, provided that $R^a$ and $R^b$ are not hydrogen at the same time, $R^2$ is a linear or branched $C_1$-$C_5$ alkyl group, trimethylsilyl group, or dimethylsilyl group, provided that, when $R^1$ is hydrogen, $R^2$ is a linear or branched $C_1$-$C_5$ alkyl group, each of $R^3$ to $R^5$ is independently hydrogen, or a linear or branched $C_1$-$C_3$ alkyl group, provided that $R^3$ to $R^5$ are not hydrogen at the same time, $R^6$ is a linear or branched $C_1$-$C_5$ alkyl group, and each of $R^7$ to $R^9$ is independently hydrogen, or a linear or branched $C_1$-$C_3$ alkyl group, provided that $R^7$ to $R^9$ are not hydrogen at the same time.

2. The compound of claim 1,
wherein, in the above Chemical Formula 1,
$R^1$ is $-NR^aR^b$, and each of $R^a$ and $R^b$ is independently hydrogen, methyl group, ethyl group, n-propyl group, iso-propyl group, n-butyl group, iso-butyl group, sec-butyl group, tert-butyl group, or dimethylsilyl group; or $R^1$ is a substituted or unsubstituted $C_4$-$C_{10}$ cyclic amine group, $R^2$ is methyl group, ethyl group, n-propyl group, iso-propyl group, n-butyl group, iso-butyl group, sec-butyl group, tert-butyl group, trimethylsilyl group, or dimethylsilyl group, and $-SiR^3R^4R^5$ is dimethylsilyl group or trimethylsilyl group.

3. The compound of claim 1,
wherein, in the above Chemical Formula 1,
$R^1$ is hydrogen,
$R^2$ is methyl group, ethyl group, n-propyl group, iso-propyl group, n-butyl group, iso-butyl group, sec-butyl group, or tert-butyl group, and
$-SiR^3R^4R^5$ is dimethylsilyl group or trimethylsilyl group.

4. The compound of claim 1,
wherein, in the above Chemical Formula 2,
$R^6$ is methyl group, ethyl group, n-propyl group, iso-propyl group, n-butyl group, iso-butyl group, sec-butyl group, or tert-butyl group, and
$-SiR^7R^8R^9$ is dimethylsilyl group or trimethylsilyl group.

5. The compound of claim 1,
wherein the silicon precursor compound is $^iPr_2NSi_2H_4N(SiHMe_2)_2$, $^{sec}Bu_2NSi_2H_4N(SiHMe_2)_2$, $^iPr_2NSi_2H_4N(^iPr)(SiMe_3)$, $^{sec}Bu_2NSi_2H_4N(^iPr)(SiMe_3)$, $(Me_2SiH)_2NSi_2H_4N(SiHMe_2)_2$, $H_5Si_2N(^iPr)(SiMe_3)$, $H_5Si_2N(^{sec}Bu)(SiMe_3)$, $H_3SiN(^iPr)(SiMe_3)$, or $H_3SiN(^{sec}Bu)(SiMe_3)$.

6. A precursor composition for forming a film, comprising a silicon precursor compound according to claim 1.

7. The precursor composition of claim 6,
wherein the silicon precursor compound is at least one selected from $^iPr_2NSi_2H_4N(SiHMe_2)_2$, $^{sec}Bu_2NSi_2H_4N(SiHMe_2)_2$, $^iPr_2NSi_2H_4N(^iPr)(SiMe_3)$, $^{sec}Bu_2NSi_2H_4N(^iPr)(SiMe_3)$, $(Me_2SiH)_2NSi_2H_4N(SiHMe_2)_2$, $H_5Si_2N(^iPr)(SiMe_3)$, $H_5Si_2N(^{sec}Bu)(SiMe_3)$, $H_3SiN(^iPr)(SiMe_3)$, and $H_3SiN(^{sec}Bu)(SiMe_3)$.

8. The precursor composition of claim 6,
wherein the film is at least one selected from a silicon-containing oxide film, a silicon-containing nitride film, and a silicon-containing carbide film.

9. The precursor composition of claim 6, further comprising:
at least one nitrogen source selected from ammonia, nitrogen, hydrazine, and dimethyl hydrazine.

10. The precursor composition of claim 6, further comprising:
at least one oxygen source selected from water vapor, oxygen, and ozone.

11. A method of forming a silicon-containing film, comprising forming a silicon-containing film using a precursor composition for forming a film comprising a silicon precursor compound according to claim 1.

12. The method of claim 11,
wherein the silicon precursor compound is at least one selected from $^iPr_2NSi_2H_4N(SiHMe_2)_2$, $^{sec}Bu_2NSi_2H_4N(SiHMe_2)_2$, $^iPr_2NSi_2H_4N(^iPr)(SiMe_3)$, $^{sec}Bu_2NSi_2H_4N(^iPr)(SiMe_3)$, $(Me_2SiH)_2NSi_2H_4N(SiHMe_2)_2$, $H_5Si_2N(^iPr)(SiMe_3)$, $H_5Si_2N(^{sec}Bu)(SiMe_3)$, $H_3SiN(^iPr)(SiMe_3)$, and $H_3SiN(^{sec}Bu)(SiMe_3)$.

13. The method of claim 11,
wherein the silicon-containing film is at least one selected from a silicon-containing oxide film, a silicon-containing nitride film, and a silicon-containing carbide film.

14. The method of claim 11,
wherein the silicon-containing film is deposited by chemical vapor deposition or atomic layer deposition.

15. The method of claim 11,
wherein the silicon-containing film is formed in a temperature range of from 100° C. to 500° C.
16. The method of claim 11,
wherein the silicon-containing film is formed in a thickness range of from 1 nm to 500 nm.
17. The method of claim 11,
wherein the silicon-containing film is formed on a substrate including trenches with an aspect ratio of from 1 to 50 and a width of from 10 nm to 1 μm.

* * * * *